(12) United States Patent
Yoshitake et al.

(10) Patent No.: US 7,554,107 B2
(45) Date of Patent: Jun. 30, 2009

(54) WRITING METHOD AND WRITING APPARATUS OF CHARGED PARTICLE BEAM, POSITIONAL DEVIATION MEASURING METHOD, AND POSITION MEASURING APPARATUS

(75) Inventors: Shusuke Yoshitake, Kanagawa (JP); Shuichi Tamamushi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 405 days.

(21) Appl. No.: 11/555,478

(22) Filed: Nov. 1, 2006

(65) Prior Publication Data
US 2007/0103659 A1 May 10, 2007

(30) Foreign Application Priority Data
Nov. 4, 2005 (JP) ............................. 2005-320300

(51) Int. Cl.
*G03B 27/42* (2006.01)
(52) U.S. Cl. .............................. 250/492.22; 250/492.3; 250/492.2; 250/492.1; 355/53; 355/30
(58) Field of Classification Search .............. 250/492.1, 250/492.2, 492.21, 492.22, 492.23, 492.3; 355/30, 53
See application file for complete search history.

(56) References Cited

U.S. PATENT DOCUMENTS
4,391,511 A * 7/1983 Akiyama et al. .............. 355/40

(Continued)

FOREIGN PATENT DOCUMENTS
JP 63095623 A * 4/1988

(Continued)

OTHER PUBLICATIONS
"Specification For Extreme Ultraviolet Lithography Mask Substrates", Semiconductor Equipment and Materials International, SEMI P37-1102, Nov. 2001. 10 Pages.

(Continued)

*Primary Examiner*—David A Vanore
*Assistant Examiner*—Michael J Logie
(74) *Attorney, Agent, or Firm*—Oblon, Spivak, McClelland, Maier & Neustadt, P.C.

(57) ABSTRACT

A charged particle beam writing method includes measuring a topography of a backside of a substrate without an influence of a gravity sag, calculating a first positional deviation amount of a pattern written on a frontside of the substrate in a case of the backside of the substrate having been corrected to be flat, based on the the backside topography of the substrate, calculating a first coefficient of a first approximate expression indicating a positional deviation correction amount for correcting the first positional deviation amount, based on the first positional deviation amount, adding the first coefficient to a second coefficient of a second approximate expression indicating a positional deviation correction amount for correcting a second positional deviation amount of the pattern written on the frontside of the substrate in a case of the backside of the substrate having not been corrected to be flat, and writing the pattern on the frontside of the substrate utilizing a charged particle beam, based on one of a positional deviation correction amount obtained by a third approximate expression indicating a positional deviation correction amount using a third coefficient obtained as a result of the adding, and the positional deviation correction obtained by the second approximate expression.

17 Claims, 23 Drawing Sheets

U.S. PATENT DOCUMENTS

| | | | | |
|---|---|---|---|---|
| 4,907,287 | A * | 3/1990 | Homma et al. | 382/255 |
| 2002/0062204 | A1 * | 5/2002 | Nakajima | 702/150 |
| 2003/0016338 | A1 * | 1/2003 | Yasuda et al. | 355/55 |
| 2005/0128462 | A1 * | 6/2005 | Matsui | 355/72 |
| 2005/0214657 | A1 * | 9/2005 | Mitsui | 430/5 |
| 2007/0103657 | A1 * | 5/2007 | Yoshitake et al. | 355/52 |

FOREIGN PATENT DOCUMENTS

JP    2004-214415    7/2004

OTHER PUBLICATIONS

"Specification For Absorbing Film Stacks And Multilayers On Extreme Ultraviolet Lithography Mask Blanks", Semiconductor Equipment and Materials International, SEMI P38-1103, Nov. 2002, 9 Pages.

"Specification For Mounting Requirements And Alignment Reference Locations For Extreme Ultraviolet Lithography Masks", Semiconductor Equipment and Materials International, SEMI P40-1103, Nov. 2003, 6 Pages.

U.S. Appl. No. 11/555,397, filed Nov. 1, 2006, Yoshitake et al.
U.S. Appl. No. 11/555,478, filed Nov. 1, 2006, Yoshitake et al.

* cited by examiner

WRITING METHOD AND WRITING APPARATUS OF CHARGED PARTICLE BEAM, POSITIONAL DEVIATION MEASURING METHOD, AND POSITION MEASURING APPARATUS

CROSS-REFERENCE TO RELATED APPLICATION

This application is based upon and claims the benefit of priority from prior Japanese Patent Application No. 2005-320300 filed on Nov. 4, 2005 in Japan, the entire contents of which are incorporated herein by reference.

BACKGROUND OF THE INVENTION

1. Field of the Invention

The present invention relates to a charged particle beam writing method, a charged particle beam writing apparatus, a positional deviation measuring method, and a position measuring apparatus, and more particularly, for example, relates to a writing method and a writing apparatus for writing a pattern on an EUV (Extreme Ultra Violet) mask using variably-shaped electron beams, and a method and an apparatus for measuring a positional deviation amount of a written pattern on the EUV mask.

2. Related Art

In recent years, circuit line widths of semiconductors are becoming narrower and narrower with an increase in pattern density. In order to precisely make large scale integrated circuits on a silicon (Si) wafer, exposure technique of transferring an original pattern written on a mask (also called a master or a reticle) is progressing. For example, technique of optical proximity effect correction of arranging sub-resolution assistant features, which are not to be printed, around an original mask pattern is developed. Alternatively, off-axis illumination technique of giving anisotropy to lights used for printing in order to partially increase resolution is developed. In addition, liquid immersion exposure technique of filling liquid, such as water or special oil having a refraction index larger than that of air, between an objective lens and a wafer to increase a resolution limit is also developed.

By virtue of these techniques, a pattern equal to or less than 90 nm, which is half of 193 nm being a wavelength of an exposure light source, is becoming producible. Particularly, in the liquid immersion exposure technique, it is shown that a pattern of 45 nm can also be printed based on a theoretical refraction index of water. Therefore, it is thought if still more ideal oil is found, a pattern of near 32 nm can be printable by utilizing the liquid immersion technique.

However, in such exposure technique, it is assumed that sub-resolution assistant features for correcting an optical proximity effect may become complicated. Although sub-resolution assistant features are patterned on a mask and not printed onto a wafer, it has an influence when an transferring image is printed on the wafer. The sub-resolution assistant features become complicated in proportion as the influence of an aerial image becomes large. Moreover, the complicated pattern has a large influence on writing time of an original mask. Furthermore, there is also a very big problem concerning the way to inspect sub-resolution assistant features on a mask.

In order to solve those problems mentioned above, shortening wavelength itself of an exposing light is also considered similar to the prior improvement techniques of lithography. Developing new lithography technique with a light of 157 nm has been given up due to lack of lens material for the optics used for image shrinking and transferring. For this reason, it is developed that the extreme ultraviolet (EUV) light with a wavelength of 13.4 nm becomes most promising at present. As to the EUV light, which is classified in wavelength to a soft-X-ray, it cannot make a projection optics any longer because it is penetrated/absorbed by all materials being discovered. Therefore, a catadioptric optics is proposed for the exposure system using the EUV light.

Concerning a technique to hold EUV masks, a method of chucking almost all the backside in a planar state is proposed instead of a conventional method of holding the circumference by three or four points in order to let transmitted lights pass. Furthermore, since the holding system itself of EUV mask is installed in a vacuum chamber in order to prevent attenuation of EUV light, it is premised on use of an electrostatic chuck, in order to hold a mask for EUV, called an EUV mask hereinafter. Guidelines for substrates to be exposed and electrostatic chucks themselves are severely defined as they are specified in the SEMI standard. Refer to, for example, "SEMI P38-1103 SPECIFICATION FOR ABSORBING FILM STACKS AND MULTILAYERS ON EXTREME ULTRAVIOLET LITHOGRAPHY MASK BLANKS", "SEMI P37-1102 SPECIFICATION FOR EXTREME ULTRAVIOLET LITHOGRAPHY MASK SUBSTRATES", or "SEMI P40-1103 SPECIFICATION FOR MOUNTING REQUIREMENTS AND ALIGNMENT REFERENCE LOCATIONS FOR EXTREME ULTRAVIOLET LITHOGRAPHY MASKS."

Then, the contents of these "SEMI P38-1103", "SEMI P37-1102", and "SEMI P40-1103" will be incorporated in the present specification.

Moreover, when fabricating a master EUV mask, it is difficult to predict total deformations of a substrate in the step of forming a reflective film, or in the process of patterning. Therefore, according to the above SEMI P40-1103, holding a substrate by an electrostatic chuck is essential for pattern writing apparatuses, position measuring apparatuses, and exposure apparatuses.

FIG. 27 shows a schematic diagram for explaining operations of a conventional variable-shaped electron beam pattern writing apparatus. As shown in the figure, the variable-shaped electron beam pattern writing apparatus (EB (Electron Beam) writing apparatus) includes two aperture plates. A first or "upper" aperture plate 410 has an opening or "hole" 411 in the shape of rectangle, for example, for shaping an electron beam 330. This shape of the rectangular opening may also be a square, a rhombus, a rhomboid, etc. A second or "lower" aperture plate 420 has a special shape of opening 421 for shaping the electron beam 330 having passed through the opening 411 of the first aperture plate 410 into a desired rectangular. The electron beam 330 that left a charged particle source 430 and has passed through the opening 411 of the first aperture plate 410 is deflected by a deflector. Then, the electron beam 330 passes through part of the special shape of opening 421 of the second aperture plate 420, and reaches a target workpiece 340 mounted on a stage which is continuously moving in one predetermined direction (e.g. X-axis direction). In other words, a rectangular shape capable of passing through both the opening 411 and the special shape of opening 421 is used for pattern writing of the target workpiece 340 mounted on the stage. This method of writing or "forming" a given variable shape by a deflector letting beams pass through both the opening 411 and the special shape of opening 421 is called the "variable shaping."

It is also very difficult to meet the guidelines of electrostatic chucks with precision and accuracy, described in the SEMI standard (SEMI P40-1103), and furthermore to check the chucks being met the specifications. Moreover, according to ITRS roadmap published by SEMATECH, the diameter of a particle on a EUV mask permitted in the process of EUV mask making is 30 nm and/or less. As to the backside of an EUV mask, a conductive film, such as Cr having sufficient adhesion to glass, is coated on the backside for an electrostatic chuck. In the case of employing the method of the electrostatic chuck, etc. in which the area of the surface contacting with a mask is large, there is much possibility of the electric conduction film on the backside being damaged by friction etc. generated at a contact part and such damaged film becoming a particle. Moreover, if a particle exists on the backside of an EUV mask, there is concern to fail to meet the requirements of image positional accuracy of the pattern because of a local deformation of the EUV mask caused by the mask backside not having a tight contact in and around the particle. Therefore, it is necessary to always retain the chuck surface to be clean. However, to retain and manage the chuck surface to be such clean is very difficult.

Furthermore, since a mask is generally used as a master in the exposure apparatus so that images can be shrunk and transferred one by one onto a wafer, only the mask which has passed a final cleaning process is used. However, in case of making an EUV mask with the pattern writing apparatus, it is necessary to use the EUV substrate with resist which being a photosensitizing polymer is applied similar to the case of writing a pattern on an optical mask. As the optical mask described herein, the one used in an exposure process by utilizing lights other than EUV lights, for example, deep ultraviolet (DUV) rays with wavelength of 248 nm and 193 nm is mentioned. Similarly to the ordinary optical mask, the resist applied on the EUV mask acts as a photosensitizing polymer and causes a chemical reaction to the intended pattern written with electron beams. As a result of this, only the part which has changed in quality by the irradiation of the electron beams on the pattern is removed (positive type resist) or a part other than the irradiated part on the pattern is removed (negative type resist) in a next development process in order to obtain a resist pattern. Then, using the resist as a protective film, chromium (layer under the resist layer, and called "absorber layer") is removed by etching in the case of an ordinary optical mask, or metal of chromium family or tantalum family being a shading film is removed by etching in the case of an EUV mask. Consequently, a mask which lets lights pass through only the removed part of absorber layer can be obtained. Then, the resist left on absorber layer as a protective film of etching is removed by chemically resist stripping process.

Regarding this resist, it needs to be applied thinly and uniformly whether it is in the optical mask case or the EUV mask case. Generally, resist is composed of a polymer film whose main component is carbon, and is applied by a spin coating technique which trickles the resist, melted in solvent, of a predetermined amount on a spinning substrate. Although there is a possibility of the resist partially going around to the side and the backside of the substrate at the time of the application, it is very difficult to remove the residues and adhesive substances, such as resist, on the side or the backside without any influence on the resist of the mask surface. In addition, after the resist is coated, baking (prebaking) is performed at a predetermined temperature for mainly stabilizing and equalizing sensitivity based on the kind and conditions of the resist.

However, even when the baking process is performed, the resist being a polymer film has a feature of easily damaged and removed. When it is necessary to load a substrate or hold a substrate during writing in the pattern writing apparatus, only limited areas are touched to handle and hold in order to avoid any contact to the inside of limited areas on the mask surface. In this situation, it is easily considered that the resist which unexpectedly goes around to the side or the backside may become a cause of particulate contamination in the pattern writing apparatus because such resist removes or attaches to a contact portion.

Furthermore, when an electrostatic chuck is used for the EUV mask, since almost all the backside of the mask contacts with the chuck, it is much expected that adhesive substances remaining on the side or backside, such as resist, are removed to become particles, and consequently they are attracted by the chucking surface of electrostatic chuck. Therefore, it becomes difficult to retain the chuck surface in a clean condition. As a result, since the particles on the electrostatic chuck surface are contacted with the mask backside, keeping the mask backside to be an ideal plane becomes difficult.

Then, another method of writing a pattern is proposed in which the backside shape of a substrate being a mask is measured during writing or before writing, in a state of the substrate being held without using the electrostatic chuck, and a positional deviation of the pattern is calculated and corrected based on the measured backside shape of the substrate. (See JP-A-2004-214415, for example.)

However, according to the technique disclosed in JP-A-2004-214415, height position distribution of the substrate backside, being opposite to the surface on which a pattern is written, is measured. Then, because of employing this method, it comes under the influence due to the gravity sag at the time of measuring the substrate backside, and there is a possibility that a amount of the gravity sag for each substrate may change depending upon a tolerance of the substrate thickness or a deformation amount may change, in each substrate, with the change of multilayer film stress peculiar to EUV masks. Therefore, a problem may arise in the reproducibility when reproducing, by calculation, a state of the substrate backside being corrected to be a desired curved or flat surface. As to a measuring device of height distribution, there is a measuring instrument utilizing an interferometer generally used to measure flatness of EUV masks. However, it is very difficult to equip this measuring instrument on the pattern writing apparatus because of structure restrictions of the apparatus. Accordingly, even if there is a measuring instrument which can be equipped on the pattern writing apparatus in consideration of the structure restrictions, there is concern that resolution of the measuring device may not enough.

As mentioned above, there is a problem that when using an electrostatic chuck for holding an EUV mask in order to write thereon in the position measuring apparatus, making the electrostatic chuck which fulfills specifications in the guidelines advocated by SEMI is very difficult. Moreover, even if it becomes possible to use the electrostatic chuck which fulfills the specifications, there is a problem, such as a particle management caused by resist peculiar to the pattern writing apparatus, namely the resist different from that of the exposure apparatus.

Furthermore, if employing the method of measuring and correcting height position distribution of the substrate backside, being opposite to the surface on which a pattern is formed, disclosed in JP-A-2004-214415, some problems are assumed: a problem that correction cannot be performed with good reproducibility because conditions change in each substrate, and a problem that resolution of height measurement data is not sufficient.

BRIEF SUMMARY OF THE INVENTION

One of objects of the present invention is to provide a pattern writing apparatus and a method thereof which enhance cleanness in the apparatus, and by which a pattern can be written at a position equivalent to the one in the case of using an electrostatic chuck. It is another object to provide a method and an apparatus of highly accurately measuring a positional deviation of a pattern written on a mask.

In accordance with one aspect of the present invention, a charged particle beam writing method includes measuring a topography of a backside of a substrate without an influence of a gravity sag, calculating a first positional deviation amount of a pattern written on a frontside of the substrate in a case of the backside of the substrate having been corrected to be flat, based on the the backside topography of the substrate, calculating a first coefficient of a first approximate expression indicating a positional deviation correction amount for correcting the first positional deviation amount, based on the first positional deviation amount, adding the first coefficient to a second coefficient of a second approximate expression indicating a positional deviation correction amount for correcting a second positional deviation amount of the pattern written on the frontside of the substrate in a case of the backside of the substrate having not been corrected to be flat, and writing the pattern on the frontside of the substrate utilizing a charged particle beam, based on one of a positional deviation correction amount obtained by a third approximate expression indicating a positional deviation correction amount using a third coefficient obtained as a result of the adding, and the positional deviation correction obtained by the second approximate expression.

In accordance with another aspect of the present invention, a charged particle beam writing apparatus which writes a pattern on a frontside of a substrate using a charged particle beam includes a positional deviation amount calculation unit for inputting information on a topography of a backside of the substrate, which is measured without an influence of a gravity sag of the substrate, and for calculating a first positional deviation amount of the pattern written on the frontside of the substrate in a case of the backside of the substrate having been corrected to be flat, based on inputted information on the backside topography of the substrate, a coefficient calculation unit for calculating a first coefficient of a first approximate expression indicating a positional deviation correction amount for correcting the first positional deviation amount, based on the first positional deviation amount, an addition unit for adding the first coefficient to a second coefficient of a second approximate expression indicating a positional deviation correction amount for correcting a second positional deviation amount of the pattern written on the frontside of the substrate in a case of the backside of the substrate having not been corrected to be flat, and a deflector for deflecting the charged particle beam, based on one of a positional deviation correction amount obtained by a third approximate expression indicating a positional deviation correction amount using a third coefficient obtained as a result of the adding, and the positional deviation correction amount obtained by the second approximate expression.

In accordance with another aspect of the present invention, a charged particle beam writing apparatus which writes a pattern on a frontside of a substrate using a charged particle beam includes a stage on which the substrate is mounted, a reference member, to be mounted on the stage, having a reference plane that is regarded as a height reference of the frontside of the substrate, a sensor for measuring height of the reference plane and height of the frontside of the substrate, a positional deviation amount calculation unit for calculating a positional deviation amount of the pattern which is generated in a case of correcting the height of the frontside of the substrate to be equivalent to the height of the reference plane when writing the pattern on the frontside of the substrate, based on a difference value between the height of the frontside of the substrate and the height of the reference plane, a coefficient calculation unit for calculating a coefficient of an approximate expression indicating a positional deviation correction amount for correcting the positional deviation amount, based on the positional deviation amount, and a deflector for deflecting the charged particle beam onto a corrected position obtained by correcting the positional deviation correction amount acquired by the approximate expression.

In accordance with another aspect of the present invention, a positional deviation measuring method includes measuring a topography of a backside of a substrate without an influence of a gravity sag, measuring, based on the backside topography of the substrate, a positional deviation amount of a first pattern in a state of the backside of the substrate being held by an electrostatic chuck, using the first pattern written when a predicted positional deviation amount of a pattern written on a frontside of the substrate being corrected in a case of the backside of the substrate having been corrected to be flat, and measuring a positional deviation amount of a second pattern in a state of the backside of the substrate being supported by a three-point support, using the second pattern written when a predicted positional deviation amount of a pattern written on a frontside of the substrate being corrected in a case of the backside of the substrate having not been corrected to be flat.

In accordance with another aspect of the present invention, a position measuring apparatus includes a holder having storage spaces in which a three-point support member for supporting a substrate at three points, and an electrostatic chuck member for holding a substrate by an electrostatic chuck are prepared, a stage on which one of the three-point support member and the electrostatic chuck member in the storage spaces of the holder is mounted, an amplifier for applying voltage to the electrostatic chuck member mounted on the stage, and a recognition unit for recognizing a position of a pattern written on the substrate supported by the three-point support member mounted on the stage and a position of a pattern written on the substrate held by the electrostatic chuck member mounted on the stage.

DETAILED DESCRIPTION OF THE INVENTION

In the following Embodiments, structures utilizing an electron beam as an example of a charged particle beam will be described. The charged particle beam is not restricted to the electron beam, and may the one using a charged particle, such as an ion beam.

EMBODIMENT 1

When writing on an EUV mask, measurement is performed as follows before a writing JOB registration, in Embodiment 1. That is, influence of the mask gravity sag is eliminated beforehand from the substrate backside topography of an EUV mask, and only the backside topography peculiar to the substrate is measured by a flatness measuring apparatus. Furthermore, when the measurement is executed, a high-precision measuring apparatus using an interferometer which is not incorporable in the pattern writing apparatus is utilized. Thereby, the topography of the backside of the mask can be measured sufficiently precisely.

A positional deviation of a pattern is calculated based on the measured backside topography information peculiar to the substrate. At the time of a registration of writing JOB, the positional deviation, calculated as one of parameters peculiar to the substrate, is inputted. Then, the coordinate system of the writing pattern is corrected based on the calculated positional deviation. The position of the writing pattern can be corrected as if the pattern were written based on the coordinate system of the case of being held by a chuck to be an ideal flat surface. That is, the positional deviation can be corrected. As to a substrate holding method, the mechanical three-point support method or the kinematical three-point clamping method by which a substrate can be held with sufficient reproducibility is used. It will be explained in detail with reference to figures.

Figure 1:
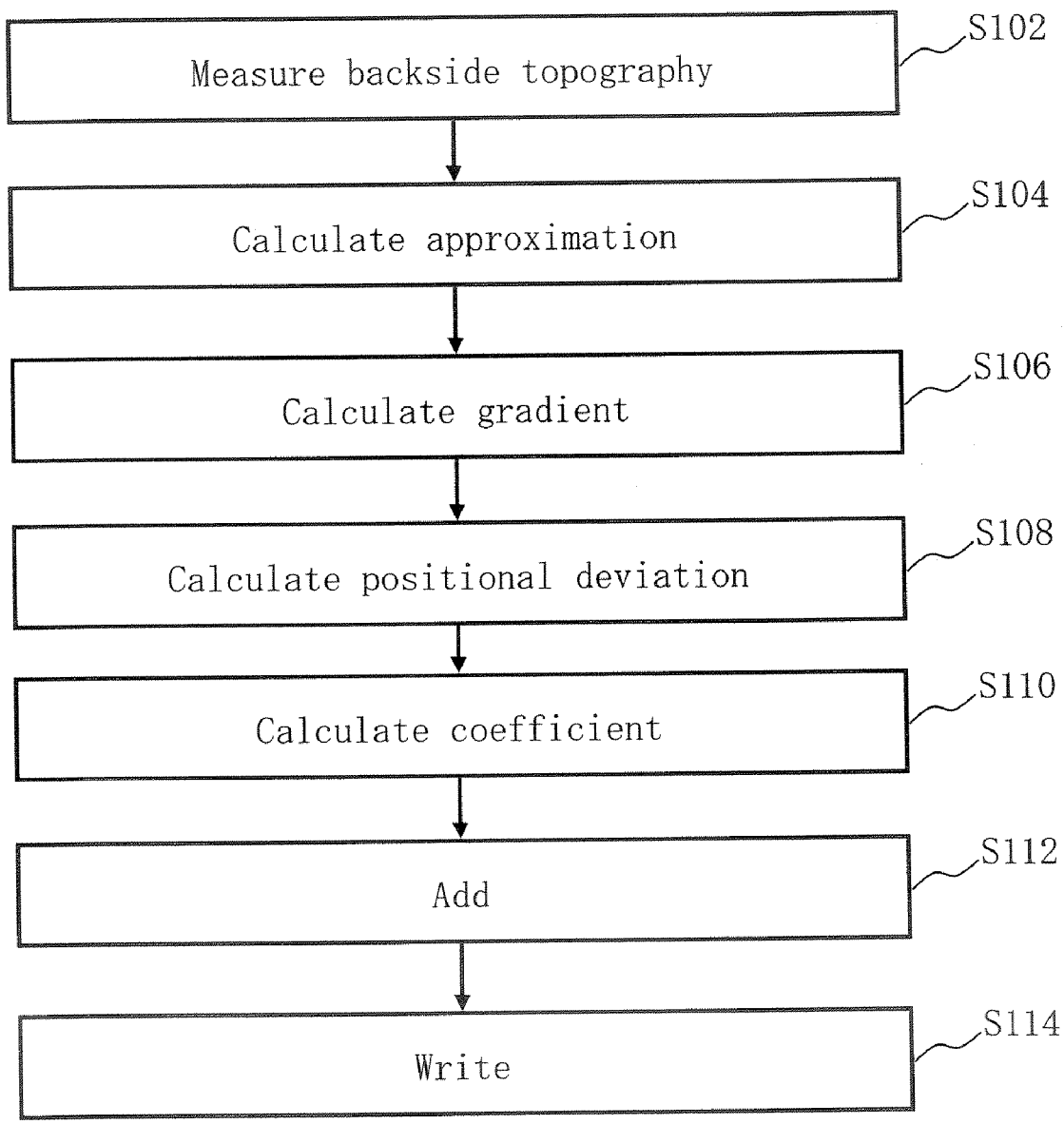
FIG. 1 is a flow chart showing main steps of an electron beam pattern writing method described in Embodiment 1.

FIG. 1 is a flowchart showing main steps of an electron beam writing method described in Embodiment 1. As shown in the figure, a series of steps of a backside topography measurement step (S102), an approximation calculation step (S104), a gradient calculation step (S106), a positional deviation amount calculation step (S108), a coefficient calculation step (S110), an addition step (S112), and a writing step (S114) is executed in the electron beam writing method.

Figure 2:
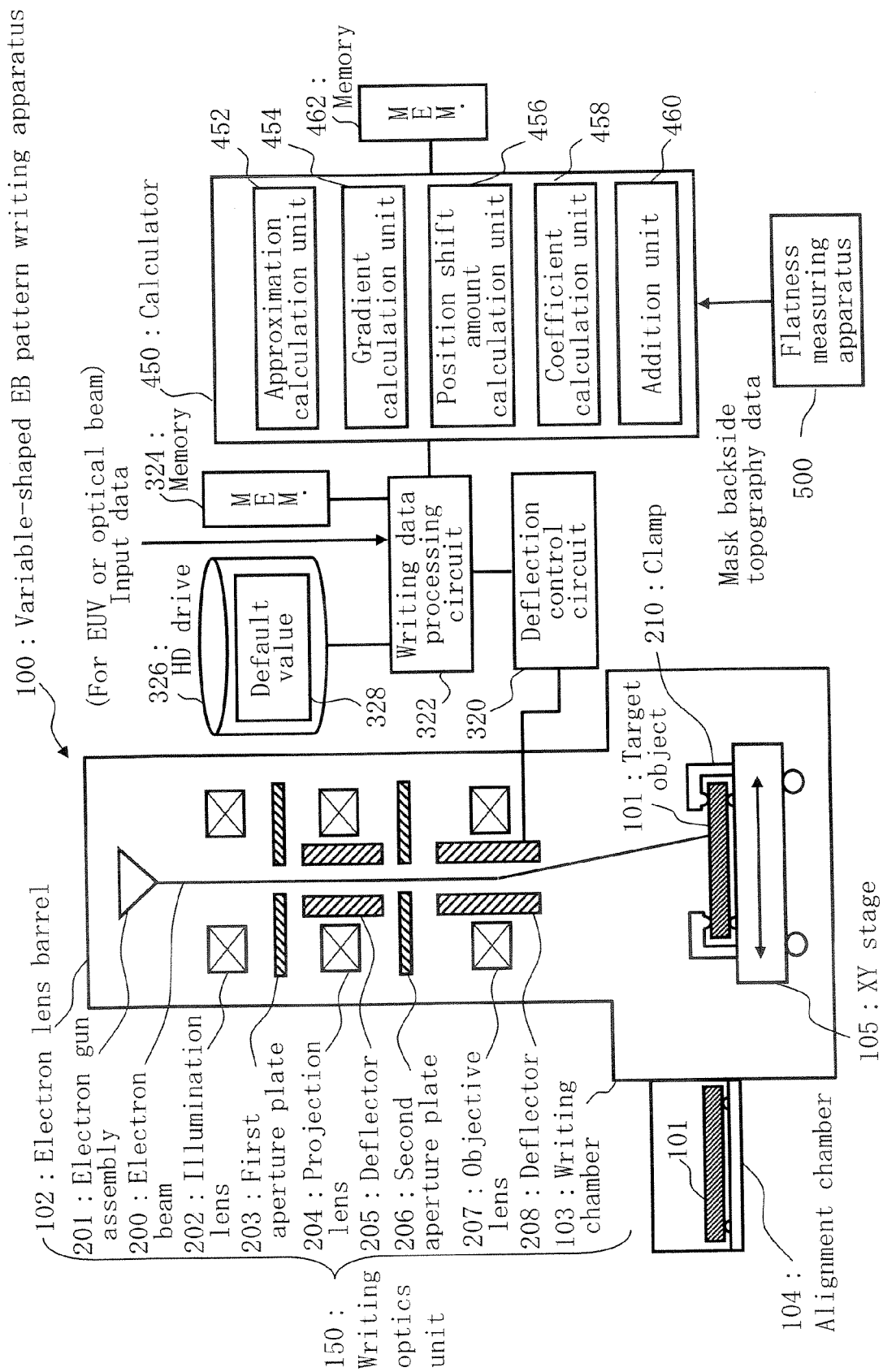
FIG. 2 is a schematic diagram showing a structure of a pattern writing apparatus described in Embodiment 1.

FIG. 2 is a schematic diagram showing a structure of the pattern writing apparatus described in Embodiment 1. As shown in the figure, a variable-shaped EB pattern writing apparatus 100, which is an example of a charged particle beam writing apparatus, includes a writing optics unit 150 composed of an electron lens barrel 102, a writing chamber 103, an XY stage 105, an electron gun assembly 201, the illumination lens 202, a first or "upper" aperture plate 203, a projection lens 204, a deflector 205, a second or "lower" aperture plate 206, an objective lens 207, and a deflector 208. In addition, the variable-shaped EB pattern writing apparatus 100 includes, as a control part, a writing data processing circuit 322, a deflection control circuit 320, a calculator 450, a memory 462, a memory 324, and a hard disk (HD) drive 326 being an example of a magnetic disk drive. The deflection control circuit 320, the calculator 450, the memory 324, and the HD drive 326 are connected to the writing data processing circuit 322. Moreover, the memory 462 is connected to the calculator 450. In the HD drive 326, a coefficient (second coefficient) of an approximation expression (second approximation expression) is stored as a default value 328. This approximation indicates a positional deviation correction amount for correcting a positional deviation at pattern writing time, generated because of deformation caused by the gravity sag of the target workpiece 101 being a mask substrate, and a positional deviation peculiar to coordinates of the system, generated by movement of the XY stage 105 or a position measurement error of the interferometer with a imperfect mirror (not illustrated), etc.

In the electron lens barrel 102, the electron gun assembly 201, the illumination lens 202, the first aperture plate 203, the projection lens 204, the deflector 205, the second aperture plate 206, the objective lens 207, and the deflector 208 are arranged. In the writing chamber 103, the XY stage 105 is arranged. On the XY stage 105, the target workpiece 101 is held by clamps 210 at three points. Moreover, an alignment chamber 104 is connected to the writing chamber 103, and alignment (position alignment) and homoiothermal processing are performed for the target workpiece 101 before being loaded to the writing chamber 103.

The calculator 450 has functions of an approximation calculation unit 452, a gradient calculation unit 454, a positional deviation calculation unit 456, a coefficient calculation unit 458, and an addition unit 460. Topography data on the backside of a mask is inputted into the calculator 450 from a flatness measuring apparatus 500 being an external apparatus. Moreover, information including data which indicates whether it is for an EUV mask or for a general optical mask other than EUV is inputted into the writing data processing circuit 322.

Structure elements required for describing Embodiment 1 are illustrated in FIG. 2, and it is also acceptable other structure elements usually needed for the variable-shaped EB pattern writing apparatus 100 are included. Moreover, processing of each function, such as the approximation calculation unit 452, the gradient calculation unit 454, the positional deviation calculation unit 456, the coefficient calculation unit 458, and the addition unit 460 is performed in the calculator 450 serving as an example of a computer, in FIG. 2. However, it is not restricted to this. It is also acceptable to execute it by hardware of an electric circuit. Alternatively, it may be executed by combination of hardware and software, or combination of hardware and firmware.

An electron beam 200, being an example of a charged particle beam and leaving the electron gun assembly 201, is irradiated or "shot", by the illumination lens 202, onto the whole of a rectangular opening, for example, which is formed in the first aperture plate 203. At this point, the electron beam 200 is shaped to have a rectangular shape, for example. Then, after having passed through the first aperture plate 203, the electron beam 200 of a first aperture image is guided by the projection lens 204 to reach the second aperture plate 206. The position of the first aperture image on the second aperture plate 206 is controlled by the deflector 205, and thereby the shape and size of the beam can be changed. After having passed through the second aperture plate 206, the electron beam 200 of a second aperture image is focus-adjusted by the objective lens 207, and deflected by the deflector 208, to reach a desired position on the target object 101, which is movably placed, on the XY stage 105. The deflecting voltage of the deflector 208 is controlled by the deflection control circuit 320.

Figure 3:
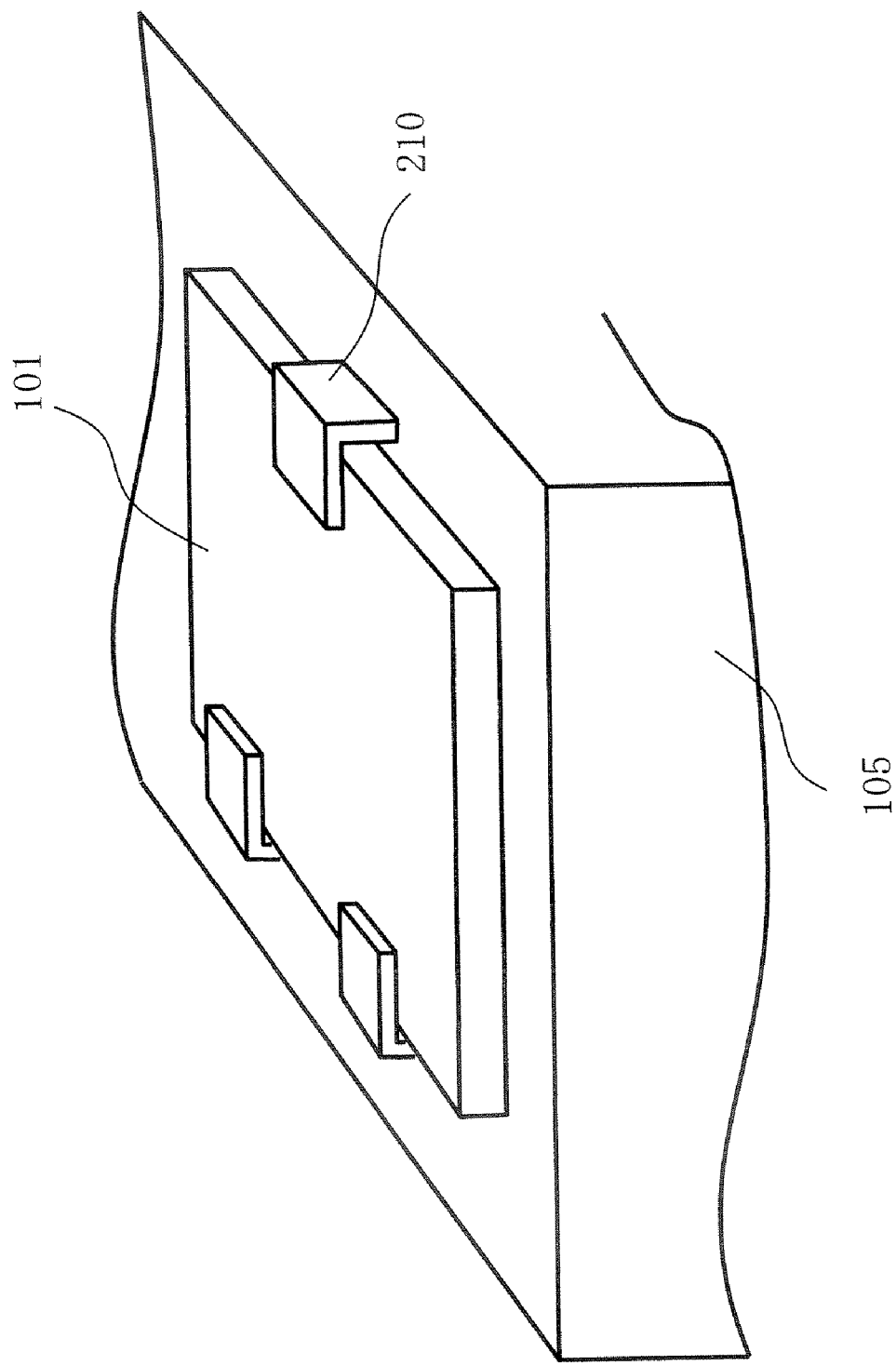
FIG. 3 is a schematic diagram showing an example of a state of holding a substrate described in Embodiment 1.

FIG. 3 is a schematic diagram showing an example of a state of holding a substrate in accordance with Embodiment 1. As shown in the figure, the target workpiece 101 being a substrate is held and clamped by clamps 210 at three points on the XY stage 105.

Figure 4:
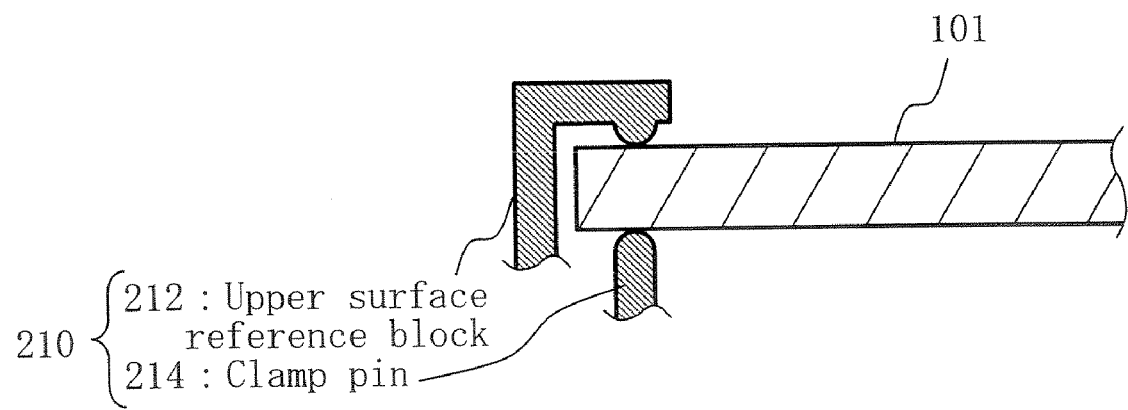
FIG. 4 is a sectional schematic diagram showing an example of the state of the substrate maintenance in Embodiment 1.

FIG. 4 is a sectional schematic diagram showing an example of a state of holding a substrate in accordance with Embodiment 1. The clamp 210 includes an upper reference block 212 and a clamp pin 214, and has a structure of holding the target workpiece 101 as being contacted the upper reference block 212 with the surface of workpiece 101, and as being contacted the clamp pin 214 with the backside of the workpiece 101, namely clamping the lower to the upper with the same axis. By virtue of clamping the target workpiece 101 at three points, the points contacting with the substrate can be minimized. Thus, particulate contamination, such as particles in the case of an electrostatic chuck, can be prevented. Consequently, it is possible to retain the cleanness of the clamp point. In addition, compared with the case of holding at a surface like an electrostatic chuck case, since the holding is performed at three points on the substrate backside, it can be hardly affected by the influence of the error of the substrate backside. As a result, errors can be reduced and excellent reproducibility can be obtained.

However, in the case the target workpiece 101 is an EUV mask, if a pattern is written on the target workpiece 101 in the above-described state, this is not the state that the substrate backside has been corrected to be flat like the case of being held by the electrostatic chuck specified in the SEMI standard. For this reason, if the target workpiece 101 is used as a mask in an exposure apparatus utilizing the electrostatic chucking operation, the position of the pattern exposed onto the wafer etc. will deviate. For example, when the size of the substrate used as the target workpiece 101 is a 152.4 mm square, the area of at least 142 mm square of its central part is held by the electrostatic chuck. In other words, the area of at least 142 mm square at the central part on the substrate backside is corrected to be flat.

Then, in Embodiment 1, the position at which the electron beam 200 is irradiated, is corrected so that the pattern can be written at a predetermined position in the state of the substrate backside having been corrected to be flat. In other words, in the case of writing the pattern on the target workpiece 101, a state similar to the state that the substrate backside has been corrected to be flat like the case of being held by the electrostatic chuck specified in the SEMI standard is generated.

Now, the case of an EUV mask being written will be explained below. In S(step) 102, as the backside shape measurement step, the substrate backside topography is measured using the flatness measuring apparatus 500 provided in the outside of the variable-shaped EB pattern writing apparatus 100. In this case, the backside topography of the substrate, being the target workpiece 101, without the influence of the gravity sag is measured.

Figure 5:
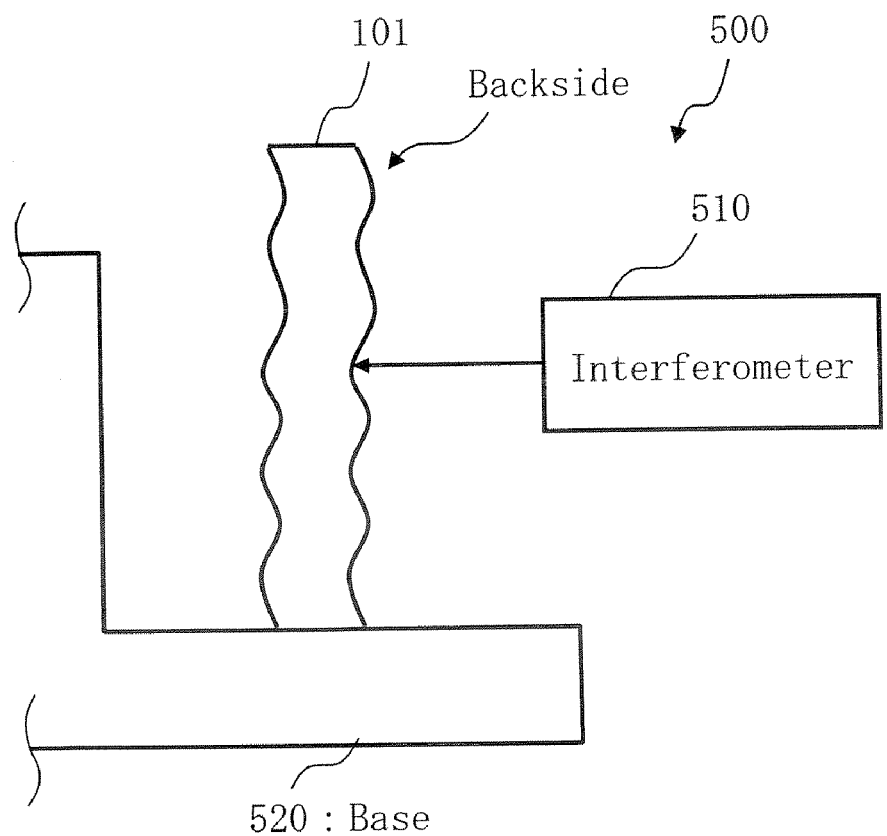
FIG. 5 is a schematic diagram for explaining a method of measuring the backside topography of a substrate by using a flatness measuring apparatus described in Embodiment 1.

FIG. 5 is a schematic diagram for explaining a method of measuring a topography of a substrate backside by using a flatness measuring apparatus in accordance with Embodiment 1. First, when measuring the substrate backside topography before the writing JOB registration, for example, the substrate being a target workpiece 101 is laid lengthwise on a base 520 as shown in FIG. 5. Then, utilizing an interference principle, an interferometer 510 measures the facing whole surface of the target workpiece 101. By virtue of using the interference principle, it is possible to measure highly accurately. Thereby, the influence of the mask substrate gravity sag can be minimized, and only the shape of the backside peculiar to the substrate can be measured with sufficient reproducibility.

Figure 6:
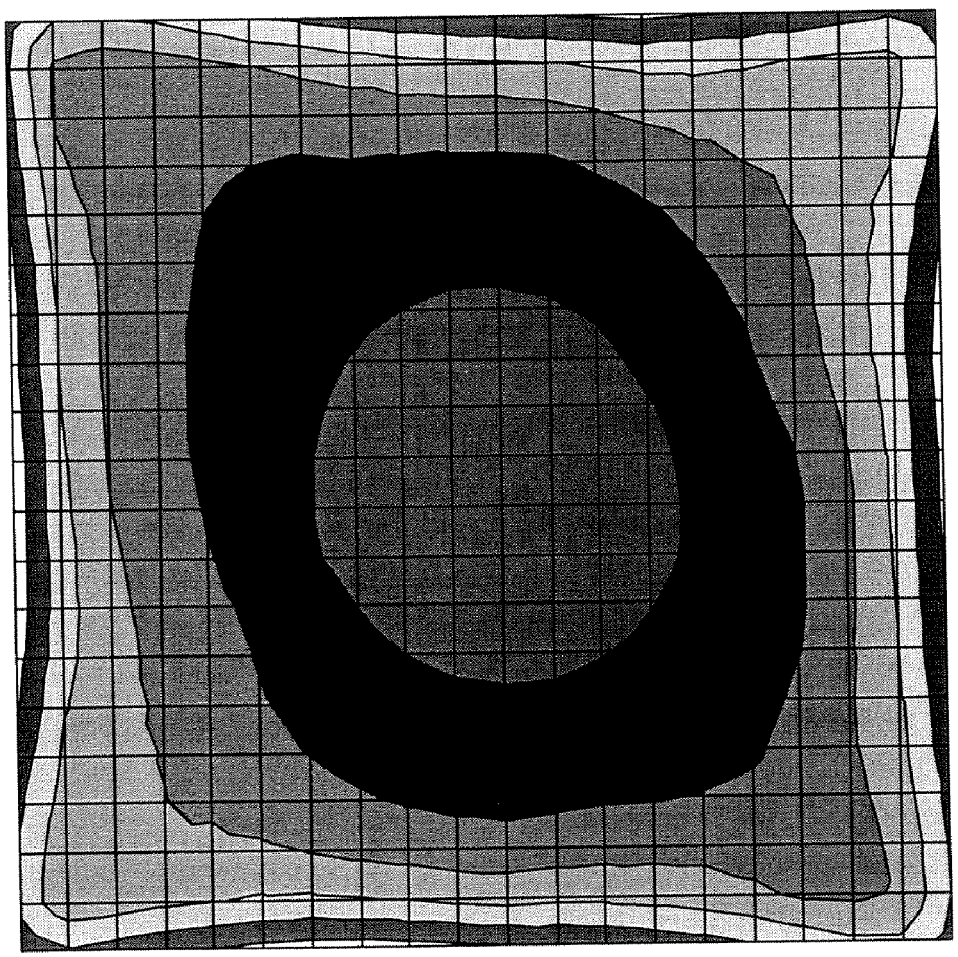
FIG. 6 is shows an example of the backside topography of a substrate described in Embodiment 1.

FIG. 6 shows an example of the backside topography of a substrate in accordance with Embodiment 1. As shown in the figure, the substrate backside has a peculiar topography caused by not only the deformation by the gravity sag but also the imperfection of processing of polishing the surface.

In S104, as the approximation calculation step, the calculator 450 inputs data of the substrate backside topography, measured by a flatness measuring apparatus. The inputted topography data may be stored in the memory 462. The approximation calculation unit 452 reads the topography data concerning the substrate backside, being backside topography information peculiar to the substrate, from the memory 462. Then, the shape distribution is performed fitting (approximation) by the fourth order polynomial, for example.

In S106, as the gradient calculation step, the gradient calculation unit 454 calculates a local gradient from a differentiation value of the approximated fourth order polynomial.

In S108, as the positional deviation amount calculation step, the positional deviation calculation unit 456 calculates a pattern positional deviation amount (first positional deviation amount), based on the substrate backside topography. The pattern positional deviation amount is a deviation amount of a pattern written on the frontside of the substrate in the case of the substrate backside having been corrected to be flat.

Figure 7:
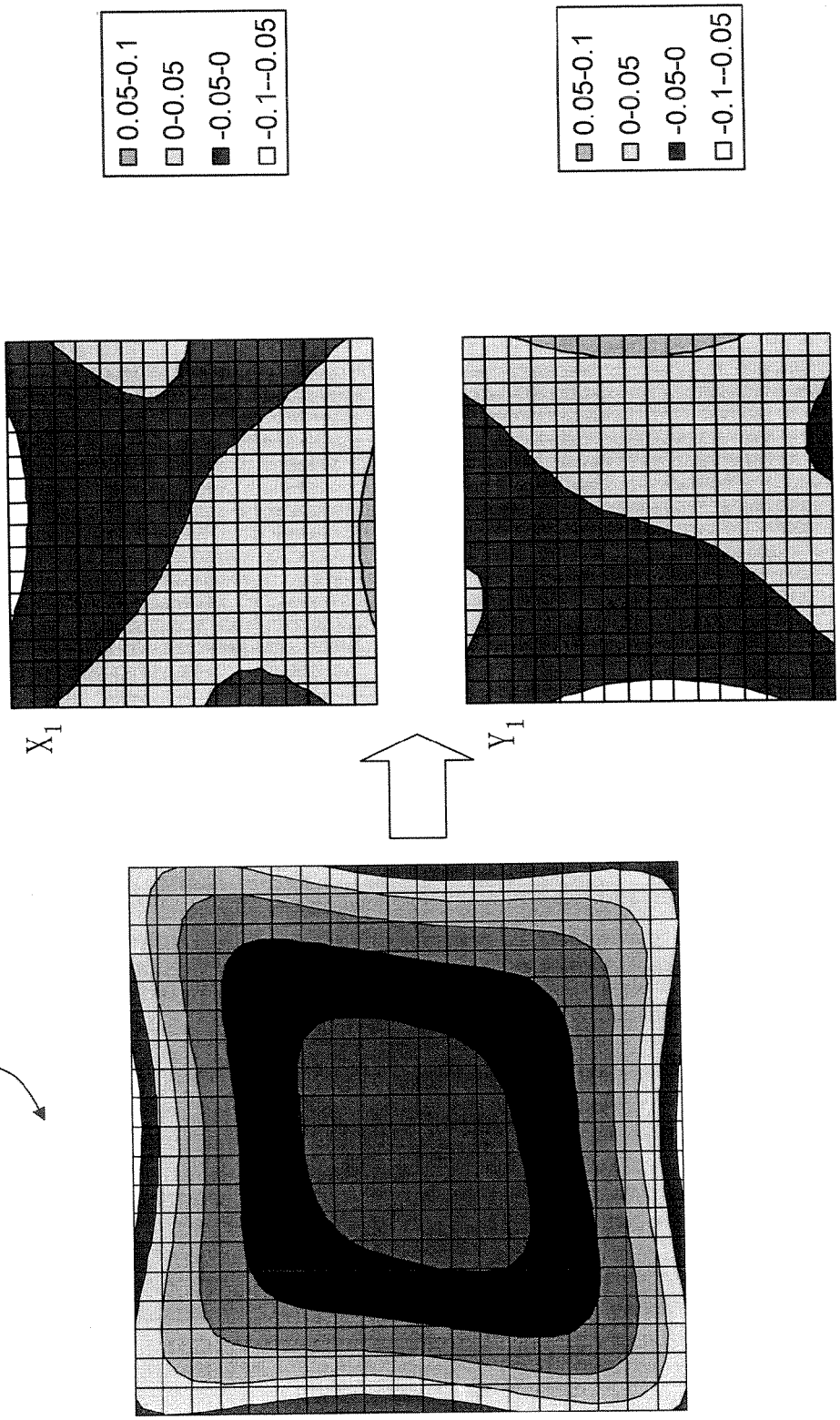
FIG. 7 shows an example of a topography, for which fitting has been performed, of the backside of a substrate described in Embodiment 1.

FIG. 7 shows an example of the substrate backside topography described in Embodiment 1, for which fitting has been performed. FIG. 7 shows that local gradient distributions with respect to the directions of X and Y can be obtained, by performing fitting of the topography distribution of the substrate backside shown in FIG. 6 using the fourth order polynomial and performing a partial differential for each of X and Y which are orthogonal.

Figure 8:
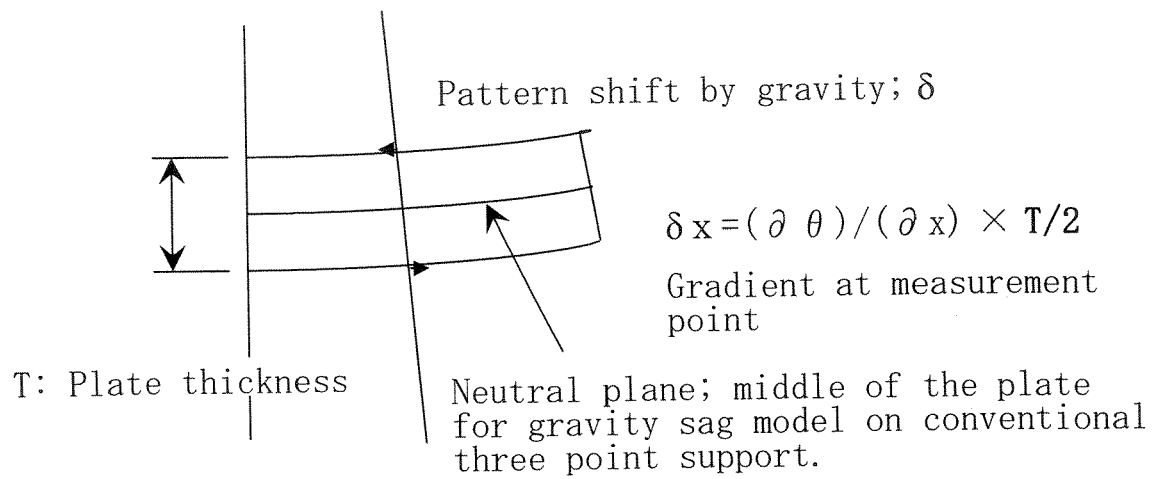
FIG. 8 is a schematic diagram for explaining a method of calculating a positional deviation described in Embodiment 1.

FIG. 8 is a schematic diagram for explaining a method of calculating a positional deviation in Embodiment 1. Extracting a local part, it will be explained with reference to FIG. 8. The thickness of the substrate being a target workpiece 101 is defined as T, and the neutral plane having no elasticity is defined as the center of the substrate. At this time, in the case of a local gradient θ being calculated by a gradient calculation unit 454, if the backside topography is corrected to be a flat surface like the case of the backside being held by an electrostatic chuck, a positional deviation or "pattern shift" δ (x, y) is generated on the substrate frontside. In the case of the mask tightly chucked and contacted to the electrostatic chuck, since a frictional force is generated between the mask and the electrostatic chuck, there is a possibility of the neutral plane deviating from the center of the substrate and shifting to the electrostatic chuck surface side, depending upon a force balance. In that case, the pattern positional deviation δ at the frontside of the mask can be calculated by multiplying a local gradient Δθ by the thickness T of the substrate and a proportionality coefficient k. In this way, distribution of the positional deviation of the pattern at the time of writing a pattern on the frontside of the substrate being the target workpiece 101 can be obtained.

Figure 9:
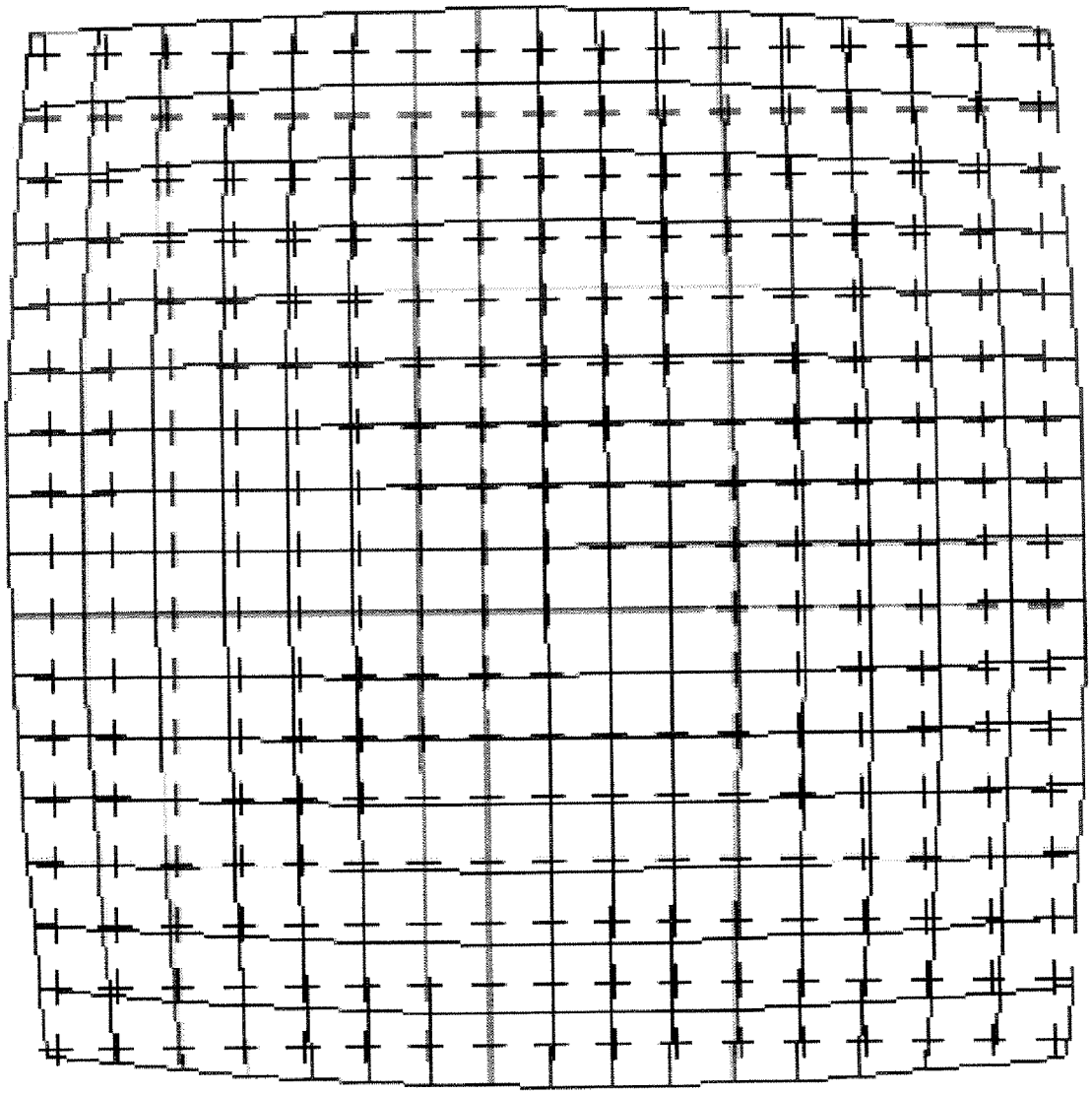
FIG. 9 shows an example of positional deviation distribution of a pattern on the frontside of a substrate described in Embodiment 1.

FIG. 9 shows an example of expected distribution of a pattern positional deviation of the frontside of the substrate with the correction of the substrate backside topography in Embodiment 1. As shown in the figure, the distribution of the pattern positional deviation of the substrate surface, generated only by the backside topography peculiar to the substrate, can be obtained based on the calculation mentioned above.

In S110, as the coefficient calculation step, the coefficient calculation unit 458 calculates a coefficient (first coefficient) of an approximate expression (first approximate expression), based on the obtained positional deviation amount. This approximate expression shows an amount of positional deviation correction for correcting the deviation amount. The approximate expression of the positional deviation correction amount in Embodiment 1 can be given by the following expressions (1-1) and (1-2):

$$x_1 = a_{10} + a_{11}x + a_{12}y + a_{13}x^2 + a_{14}xy + a_{15}y^2 + a_{16}x^3 + a_{17}x^2y + a_{18}xy^2 + a_{19}y^3 \quad (1\text{-}1)$$

$$y_1 = b_{10} + b_{11}x + b_{12}y + b_{13}x^2 + b_{14}xy + b_{15}y^2 + b_{16}x^3 + b_{17}x^2y + b_{18}xy^2 + b_{19}y^3 \quad (1\text{-}2)$$

Based on the positional deviation of the positional deviation distribution obtained in FIG. 9, a grid correction amount (positional deviation correction amount) written by fitting of a third order polynomial can be calculated. A coefficient ($a_{10}$, $a_{11}$, ..., $a_{19}$) with respect to the direction X shown in the expression (1-1) and a coefficient ($b_{10}$, $b_{11}$, ..., $b_{19}$) with respect to the direction Y shown in the expression (1-2), which are necessary for approximating a third order polynomial of the direction X and the direction Y, are obtained by calculation. If setting such coefficients as parameters in the writing data processing circuit 322, it is possible to correct the positional deviation based on the deformation amount peculiar to the substrate backside topography, that gravity sag is free What is obtained by adding the coefficients of the polynomial expressions obtained here, to the coefficient of the third order polynomial used in the usual case of having no backside correction as mentioned below, is used for writing of the substrate.

As mentioned above, a substrate backside topography in the case of influence of the gravity sag having been eliminated can be acquired in Embodiment 1. As a result, the intrinsic deformation amount, namely without the influence of the gravity sag, of the substrate can be obtained. Therefore, the deformation amount of the substrate frontside in the case of the substrate backside being corrected to be flat like the case of being held by the electrostatic chuck specified in the SEMI standard can be acquired. By calculating the first positional deviation amount of a pattern written based on the deformation amount, the first coefficient of the first approximate expression indicating an amount of positional deviation correction for correcting the first positional deviation amount can be obtained.

In S112, as the addition step, the addition unit 460 adds the first coefficient to the second coefficient. The second coefficient herein is a coefficient of the approximate expression (second approximate expression). The approximate expression (second approximate expression) indicates a positional deviation correction amount for correcting the positional deviation amount (second positional deviation amount) of a pattern written on the frontside of a substrate without correcting the substrate backside to be flat. The coefficient parameter used as the second coefficient is stored in the HD drive 326 as the default value 328 of the pattern writing apparatus. Therefore, the addition unit 460 reads the default value 328 from the HD drive 326 through the writing data processing circuit 322, and adds the coefficient (first coefficient) obtained by the coefficient calculation unit 458. The approximate expression of a positional deviation correction amount peculiar to the system in Embodiment 1 can be given by the expressions (2-1) and (2-2).

$$x_0 = a_{s0} + a_{s1}x + a_{s2}y + a_{s3}x^2 + a_{s4}xy + a_{s5}y^2 + a_{s6}x^3 + a_{s7}x^2y + a_{s8}xy^2 + a_{s9}y^3 \quad (2\text{-}1)$$

$$y_0 = b_{s0} + b_{s1}x + b_{s2}y + b_{s3}x^2 + b_{s4}xy + b_{s5}y^2 + b_{s6}x^3 + b_{s7}x^2y + b_{s8}xy^2 + b_{s9}y^3 \quad (2\text{-}2)$$

As stated above, in the variable-shaped EB pattern writing apparatus 100, since the mask substrate for EUV being the target workpiece 101 is horizontally held by the clamps at three points without using the electrostatic chuck, a positional deviation at the time of pattern writing, because of deformation caused by deflection by the gravity sag of the target workpiece 101 being the writing mask substrate, is generated. In addition, a positional deviation peculiar to the system arises. Therefore, in order to correct these positional deviations, a grid correction amount (positional deviation correction amount) written by performing fitting of the third order polynomial is calculated beforehand. A coefficient with respect to X direction ($a_{s0}$, $a_{s1}$, ..., $a_{s9}$) shown in the expression (2-1) and a coefficient with respect to Y direction ($b_{s0}$, $b_{s1}, \ldots, b_{s9}$) shown in the expression (2-2), which are required for approximating the third order polynomial with respect to X direction and Y direction, are calculated beforehand. The coefficient (second coefficient) of the approximate expression (second approximate expression) indicating the positional deviation correction amount is stored as the default value 328. The approximate expression of the positional deviation correction amount after being added in Embodiment 1 can be given by the expressions (3-1) and (3-2).

$$X_1 = (a_{s0}+a_{10}) + (a_{s1}+a_{11})x + (a_{s2}+a_{12})y + (a_{s3}+a_{13})x^2 + (a_{s4}+a_{14})xy + (a_{s5}+a_{15})y^2 + (a_{s6}+a_{16})x^3 + (a_{s7}+a_{17})x^2y + (a_{s8}+a_{18})xy^2 + (a_{s9}+a_{19})y^3 \quad (3\text{-}1)$$

$$Y_1 = (b_{s0}+b_{10}) + (b_{s1}+b_{11})x + (b_{s2}+b_{12})y + (b_{s3}+b_{13})x^2 + (b_{s4}+b_{14})xy + (b_{s5}+b_{15})y^2 + (b_{s6}+b_{16})x^3 + (b_{s7}+b_{17})x^2y + (b_{s8}+b_{18})xy^2 + (b_{s9}+b_{19})y^3 \quad (3\text{-}2)$$

Based on the approximation expression shown by the expressions (3-1) and (3-2), it is possible to obtain a positional deviation correction amount which is calculated by adding each coefficient of the third order polynomial, and adding the correction amount of positional deviation peculiar to the system to the correction amount of positional deviation peculiar to the substrate backside topography that gravity sag is free.

In Embodiment 1, the case has been described in which the third order polynomial is used as an approximate expression indicating the positional deviation correction amount for correcting the positional deviation peculiar to the coordinates of the system of the electron beam pattern writing apparatus. However, it is also acceptable to use a polynomial expression having an order of fourth or more. In that case, it is desirable for the polynomial expression which performs fitting of the topography showing the backside of an EUV mask, to have an order of +1, in order to be in accordance with the order of the approximate expression indicating the positional deviation correction amount for correcting the positional deviation peculiar to the coordinates of the system of the pattern writing apparatus. That is, when the approximate expression indicating the positional deviation correction amount for correcting the positional deviation peculiar to the coordinates of the system of the pattern writing apparatus is the fourth order polynomial, it is desirable to perform approximation by using the fifth order polynomial.

In S114, as the writing step, the writing optics unit 150 writes a pattern on the frontside of the substrate being the target workpiece 101, using the electron beam 200, based on a positional deviation correction amount obtained by the approximate expression (third approximate expression) indicating the positional deviation correction amount using an additional value (third coefficient) acquired as a result of the addition. That is, in the writing data processing circuit 322, information on the positional deviation correction amount obtained by the approximate expression indicating the positional deviation correction amount using the coefficient obtained as a result of the addition is output to the deflection control circuit 320. Then, deflecting voltage controlled by the deflection control circuit 320 is applied to the deflector 208. The electron beam 200 is irradiated onto a predetermined position because the deflector 208 deflects the electron beam 200 by a controlled deflection voltage. Therefore, by adding the first coefficient to the second coefficient which the apparatus intrinsically has, it is possible to deflect a charged particle beam onto the same position as the case of being held by the electrostatic chuck specified in the SEMI standard even if the substrate is not held by the electrostatic chuck.

Figure 10:
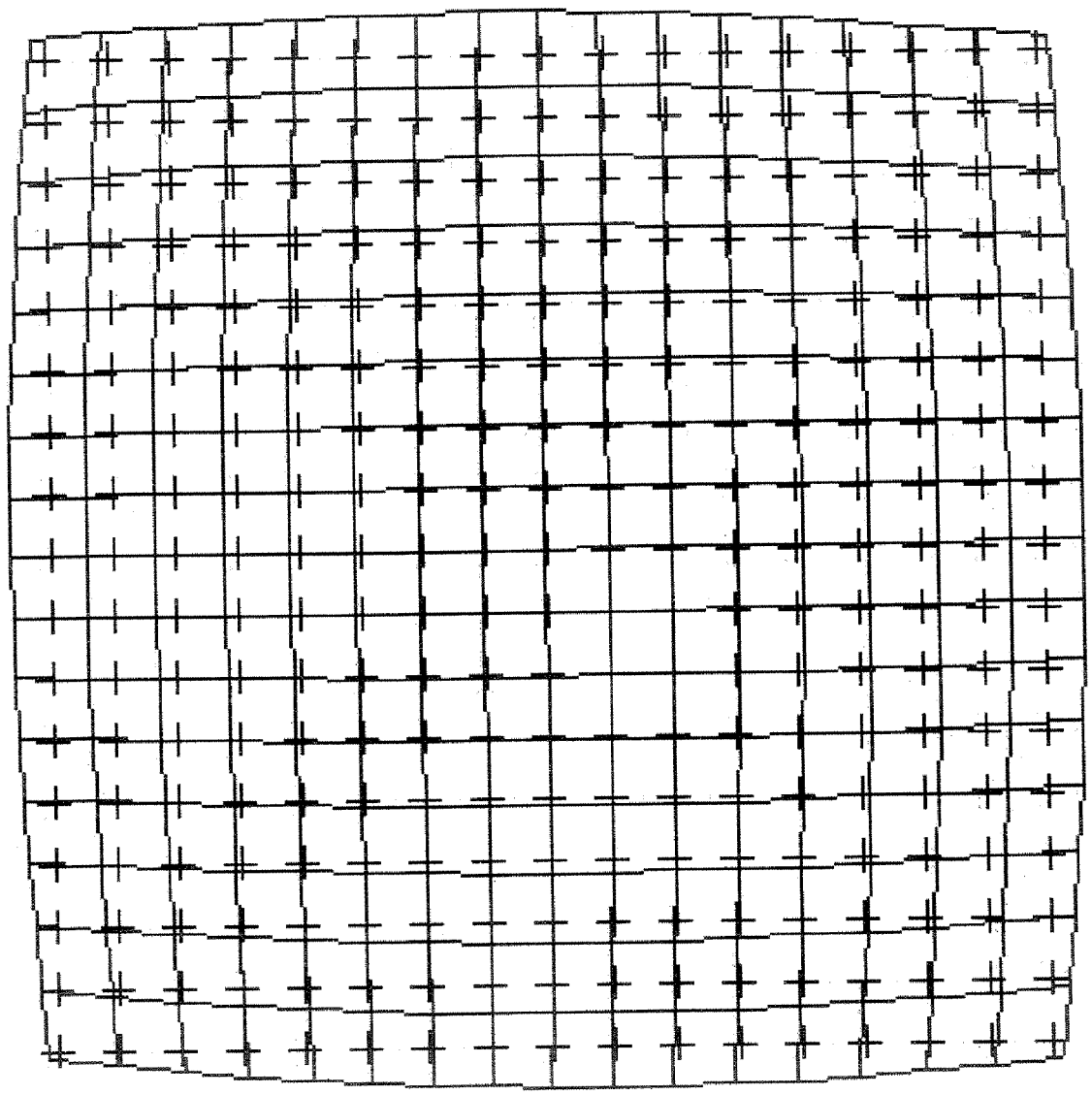
FIG. 10 shows an example of distribution of positional deviation correction amount for correcting deformation by holding on a flat chuck with data of the substrate backside topography obtained without the influence of gravity sag, described in Embodiment 1.

FIG. 10 shows an example of distribution of positional deviation correction amount for correcting the deformation by holding on a flat chuck with data of the substrate backside topography obtained without the influence of gravity sag in Embodiment 1.

Figure 11:
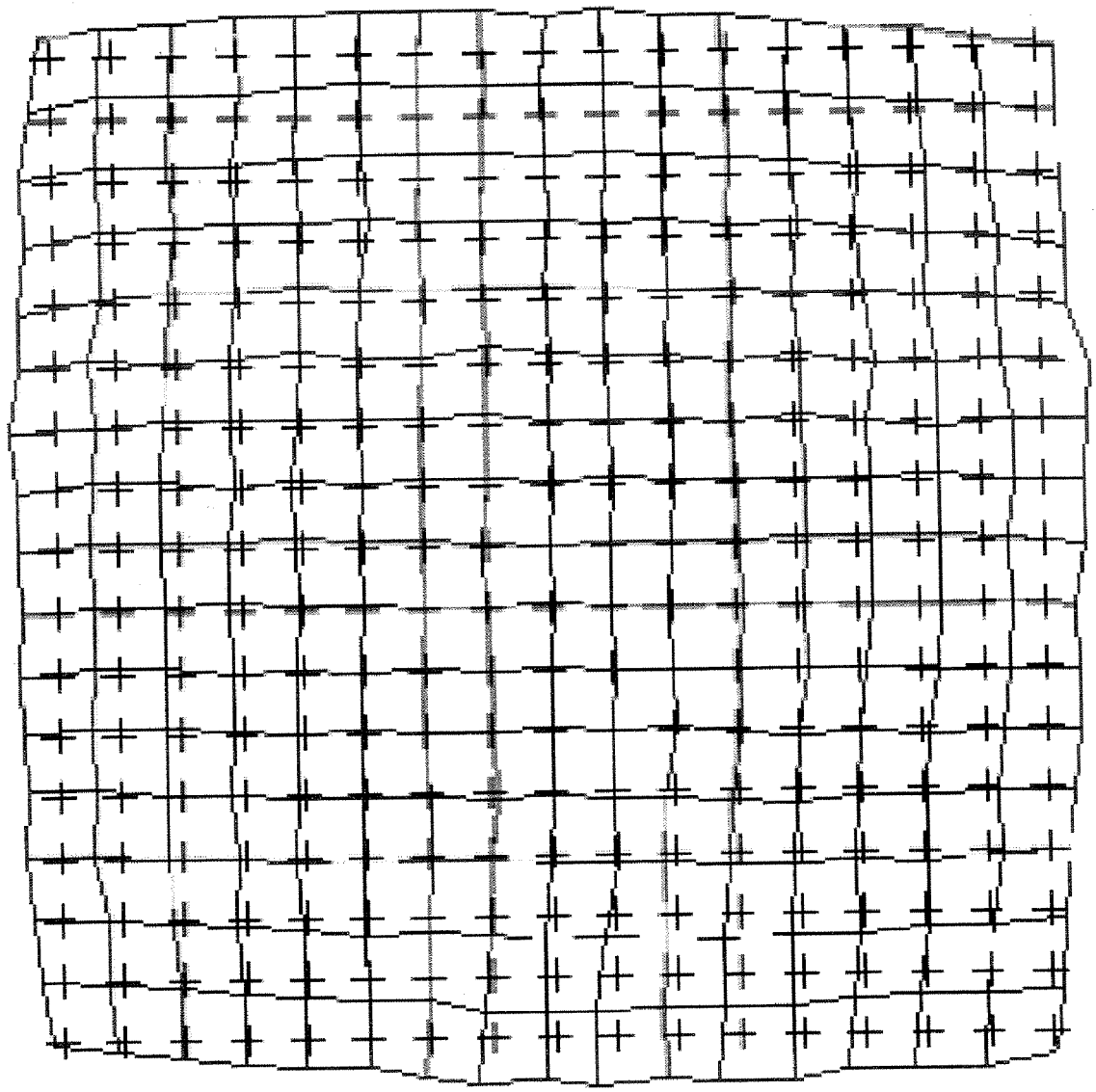
FIG. 11 shows an example of pattern position distribution of an EUV mask written with positional deviation correction for correcting deformation by holding on a flat chuck with data of the substrate backside topography obtained without the influence of gravity sag, described in Embodiment 1.

FIG. 11 shows an example of pattern position distribution of an EUV mask written with positional deviation correction for correcting deformation by holding on a flat chuck with data of the substrate backside topography obtained without the influence of gravity sag in Embodiment 1.

Figure 12:
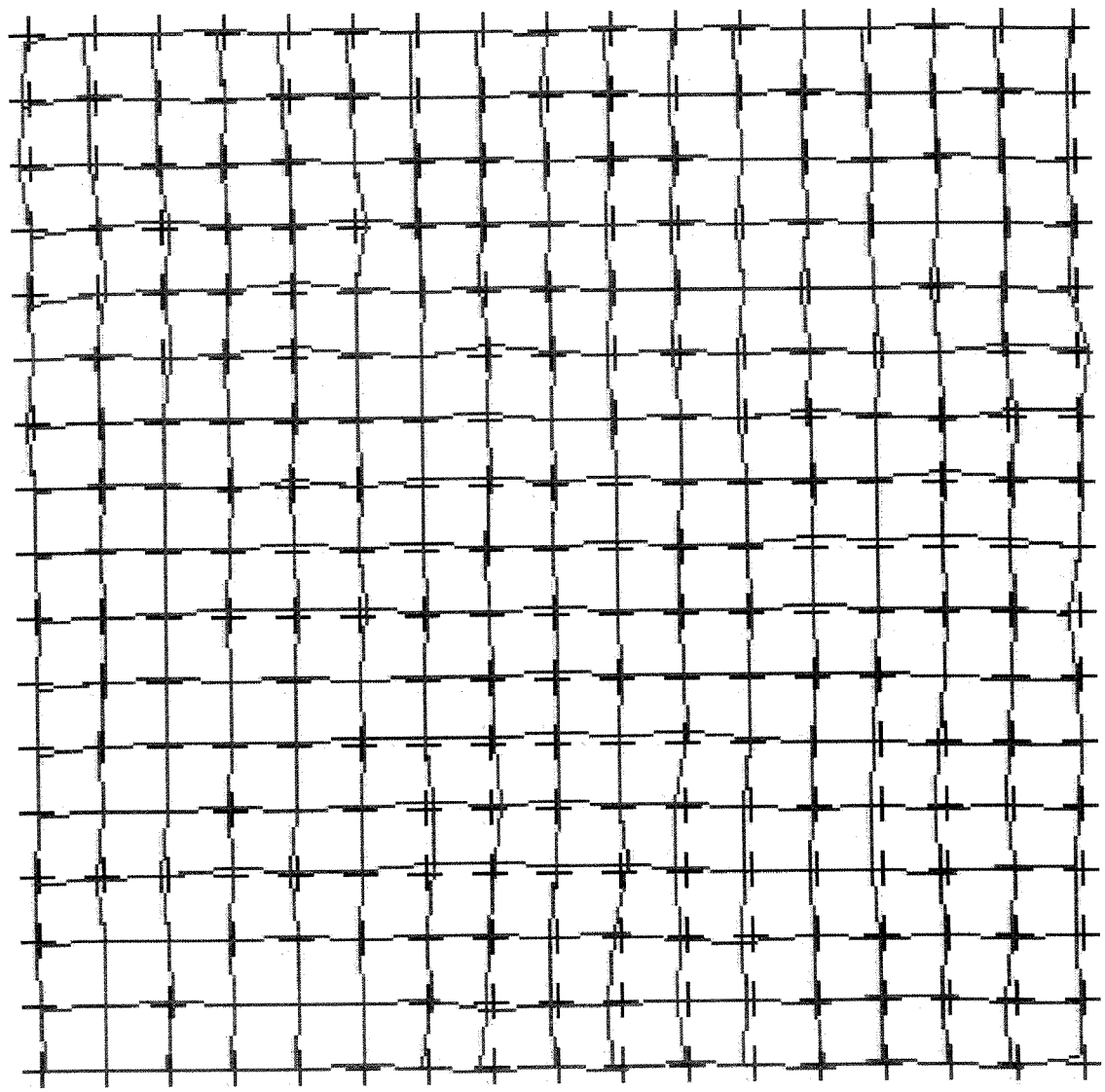
FIG. 12 shows distribution of positional deviation between FIG. 10 and FIG. 11.

FIG. 12 shows distribution of positional deviation between FIGS. 10 and 11. In FIG. 12, deformation, such as varying the distribution, is not shown and the shape becomes almost a square, it turns out that the predicted positional deviation correction amount shown in FIG. 10 is right and the positional deviation correction according to Embodiment 1 is effective.

As mentioned above, by adding the coefficient (first coefficient) obtained by the coefficient calculation unit 458 to the default value 328, it is possible to correct the position to be the one in the case of using the electrostatic chuck even when the target workpiece 101 is held by the three clamps 210. The three clamps 210 horizontally hold the substrate for the EUV mask being the target workpiece 101. Then, in this state, writing is performed by the variable-shaped EB pattern writing apparatus 100. As known from this case, even if the electrostatic chuck is not used, it is possible to correct the position to be the one in the case of using the electrostatic chuck.

Moreover, a function "constant temperature" is usually provided. This function indicates not to start writing until temperature of a substrate has been stabilized, namely to wait until the temperature becomes constant in a vacuum state within the alignment chamber 104 for a predetermined time period. However, in the case of an EUV mask, such waiting time for the constant temperature is unnecessary because a material with an extremely small thermal expansion coefficient is used for the substrate of the EUV mask, differing from a quartz substrate of a usual optical mask. Therefore, what is necessary for the writing data processing circuit 322 is only to identify whether it is an EUV mask or a usual optical mask, based on the data inputted, and to alternatively perform a pattern positional deviation correction based on information on the backside topography of the substrate only when it is an EUV mask. Information on whether it is an EUV mask or a usual optical mask is previously input into the writing data processing circuit 322 at the time of writing JOB registration. As to the method of inputting data, a parameter file, a manual inputting, etc. is acceptable. In other words, it is preferable to have a structure in which, when writing an EUV mask, the writing data processing circuit 322 automatically performs cancelling even if aging time for a constant temperature is designated.

Furthermore, in the case of using a usual optical mask, not an EUV mask, what is necessary is only to correct a positional deviation peculiar to the system, since it is unnecessary to correct positional deviation by the substrate backside topography to be flat by the electrostatic chuck. Therefore, the steps of positional deviation correction from S102 to S112 become unnecessary. The writing data processing circuit 322 identifies whether it is an EUV mask or a usual optical mask, based on the data previously input at the time of writing JOB registration. Furthermore, it is preferable to have a structure in which, only when the case of an EUV mask, a pattern positional deviation correction based on the backside topography information on the substrate, namely the steps from S102 to S112, is selectively performed. In the case of a usual optical mask, it is structured that the writing data processing circuit 322 performs a pattern positional deviation correction using the default value 328 as it is, without carrying out the steps from S102 to S112.

That is, in the writing step mentioned above, it is preferable to have a structure, when the substrate is for the EUV mask, a pattern is written on the substrate frontside based on the positional deviation correction amount obtained by the third approximate expression indicating the amount of positional deviation correction using the third coefficient, and when the substrate is not for the EUV mask, a pattern is written on the substrate frontside based on the positional deviation correction amount obtained by the second approximate expression indicating the amount of positional deviation correction using the second coefficient.

As mentioned above, it is assumed that deformation based on a backside topography peculiar to each substrate arises by making the substrate be held to the electrostatic chuck. Such deformation causes a positional deviation of a pattern. According to Embodiment 1, it becomes possible to accurately predict and correct the pattern positional deviation even when the three-point support method (clamping at three positions) is used. Furthermore, reproducibility can be well retained by virtue of using the three-point support method. Therefore, it is possible to accurately predict and correct the pattern positional deviation without using the electrostatic chuck required when writing an EUV mask. Moreover, by switching using or not using correction information depending upon the kind of a mask to be written, it is possible to write similarly whether the mask is an EUV mask or an optical mask. Furthermore, in the case of writing an EUV mask, it is possible to reduce the total of writing process by skipping the waiting time for temperature stabilizing.

As mentioned above, according to Embodiment 1, even if the electrostatic chuck is not used, a writing position can be corrected to be the position in the case of using the electrostatic chuck. Therefore, even if the electrostatic chuck is not used, it is possible to write at the position in the case of using the electrostatic chuck. Accordingly, it is possible to reproduce a more ideal surface than the one in the case of using the electrostatic chuck, and the reproducibility of writing can be improved.

EMBODIMENT 2

In Embodiment 1, the mask pattern writing apparatus capable of executing a pattern positional deviation correction highly accurately, with sufficient reproducibility, at the time of EUV mask writing, based on topography information on the substrate backside has been explained. When evaluating position accuracy of a mask pattern written by such mask pattern writing apparatus, and when evaluating writing performance of such mask pattern writing apparatus, which can be obtained from the written mask, a position accuracy evaluation apparatus is used which can select an electrostatic chuck or a three-point support method as a holding system of the substrate. In Embodiment 2, the position measuring apparatus that can select the electrostatic chuck or the three-point support method will be explained.

Figure 13:
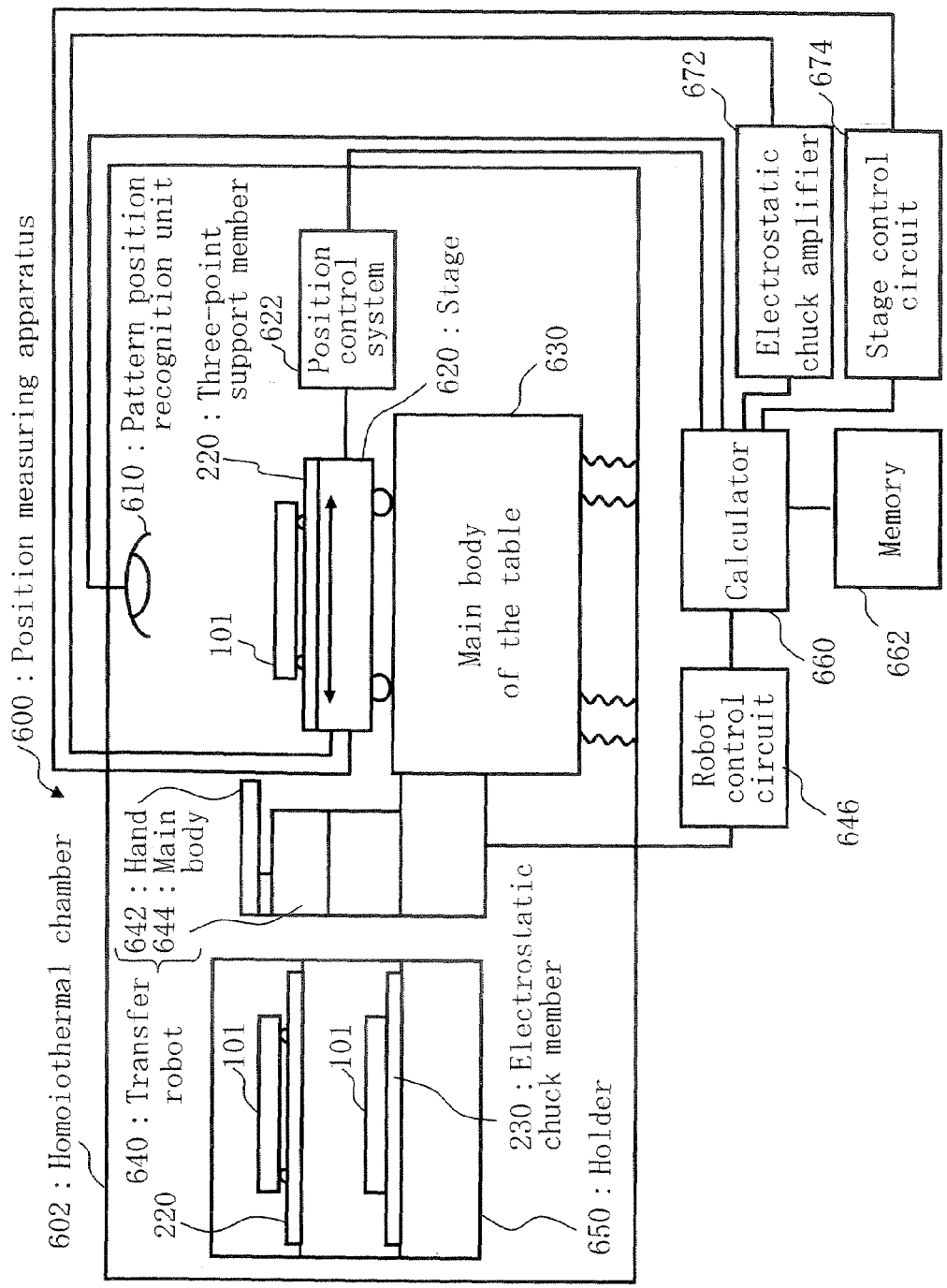
FIG. 13 is a schematic diagram showing a structure of a position measuring apparatus described in Embodiment 2.

FIG. 13 is a schematic diagram showing a structure of a position measuring apparatus described in Embodiment 2. As shown in the figure, a position measuring apparatus 600 includes a homoiothermal chamber 602, a pattern position recognition unit 610, a stage 620, a position control system 622, a main body of the table 630, a transfer robot 640, a holder 650 being an example of an arrangement portion, a robot control circuit 646, a calculator 660, a memory 662, an electrostatic chuck amplifier 672, and a stage control circuit 674. In the homoiothermal chamber 602, the pattern position recognition unit 610, such as a CCD camera, the stage 620, the position control system 622, the main body of the table 630, the transfer robot 640, and the holder 650 are arranged. The robot control circuit 646, the memory 662, the electrostatic chuck amplifier 672, and the stage control circuit 674 are connected to the calculator 660 to be controlled by it.

The inside of the homoiothermal chamber 602 is controlled to have a constant temperature, and the main body of the table 630 has a vibration isolation function. In the holder 650, a plurality of tiers as arrangement space (storing spaces) exists, or "the holder 650 has storage spaces." and the first set composed of a three-point support member 220 and the target workpiece 101 laid or "supported" on the three-point support member 220, or the second set composed of an electrostatic chuck member 230 and the target workpiece 101 laid or "hold" on the electrostatic chuck member 230 is stored, or "prepared" therein. Moreover, the transfer robot 640 includes a hand 642 and a main body 644. Using the hand 642, the transfer robot 640 controlled by the robot control circuit 646 takes out the first set or the second set from the holder 650, and conveys it onto the stage 620. Moreover, using the hand 642, the transfer robot 640 takes the first set or the second set from the stage 620, and stores it in the holder 650.

Components required for explaining Embodiment 2 are described in FIG. 13. In addition, other structure elements usually required for the position measuring apparatus 600 may also be contained.

In the position measuring apparatus, when measuring a position assumed in the case of a pattern written on an EUV mask being printed onto a wafer, an electrostatic chuck is used to measure. When measuring a position of a pattern written in order to manage conditions and writing accuracy of the pattern writing apparatus which writes an EUV mask, the ordinary three-point support is selectively used to measure.

Now, the operation of the position measuring apparatus 600 when measuring a position assumed in the case of a pattern written on the EUV mask being printed onto a wafer will be explained. First, the transfer robot 640, using the hand 642, takes out the second set utilizing the electrostatic chuck from the holder 650, conveys it to the stage 620, and mounts it on the stage 620. Then, in the state of the electrostatic chuck member 230 being mounted on the stage 620, voltage is applied to the electrostatic chuck member 230 by the electrostatic chuck amplifier 672 through the stage 620. Thereby, the target workpiece 101 mounted on the electrostatic chuck member 230 is attracted and attached to the electrostatic chuck member 230 to be held by the chuck.

With keeping such state, the stage 620 is moved in the XY directions by the stage control circuit 674, and the pattern written on the EUV mask is recognized by the pattern position recognition unit 610 to be imaged. Then, the imaged picture is sent to the calculator 660, with position information controlled by the position control system 622. The position of the pattern written on the EUV mask is measured based on the imaged picture and the position information. By measuring the position of the pattern written on the EUV mask, a positional deviation from a desired position which is intended in the case of being held by the electrostatic chuck can be measured.

Next, operations of the position measuring apparatus 600 in the case of measuring a position of a pattern written in order to manage conditions and writing accuracy of the pattern writing apparatus which writes the EUV mask will be explained. Using the hand 642, the transfer robot 640 takes out the first set utilizing a three-point support from the holder 650, conveys it to the stage 620, and mounts it on the stage

620. Since the target workpiece 101 is just mounted on the three-point support member 220, with retaining this state, it is imaged by the pattern position recognition unit 610. Then, the pattern position recognition unit 610 recognizes and images the pattern written on the EUV mask, with the stage 620 moving in the XY directions by the stage control circuit 674. The imaged picture is sent to the calculator 660 with position information controlled by the position control system 622. The position of the pattern written on the EUV mask is measured based on the imaged picture and the position information. By measuring the position of the pattern written on the EUV mask, it is possible to measure the positional deviation from a desired position which is intended in the case of being clamped at three places by the clamp 210 of the variable-shaped EB pattern writing apparatus 100. That is, accuracy of the pattern writing apparatus can be evaluated.

As mentioned above, when evaluating accuracy of a pattern position which is assumed when the pattern written on the EUV mask is printed onto a wafer, it is possible, by using the electrostatic chuck, to evaluate whether backside topography correction functions correctly or not. Moreover, by using the ordinary three-point support which can hold the substrate with excellent reproducibility and little possibility of adhesion of particulate contamination, it is possible to evaluate the accuracy of the mask writing apparatus for writing an EUV mask.

Figure 14:
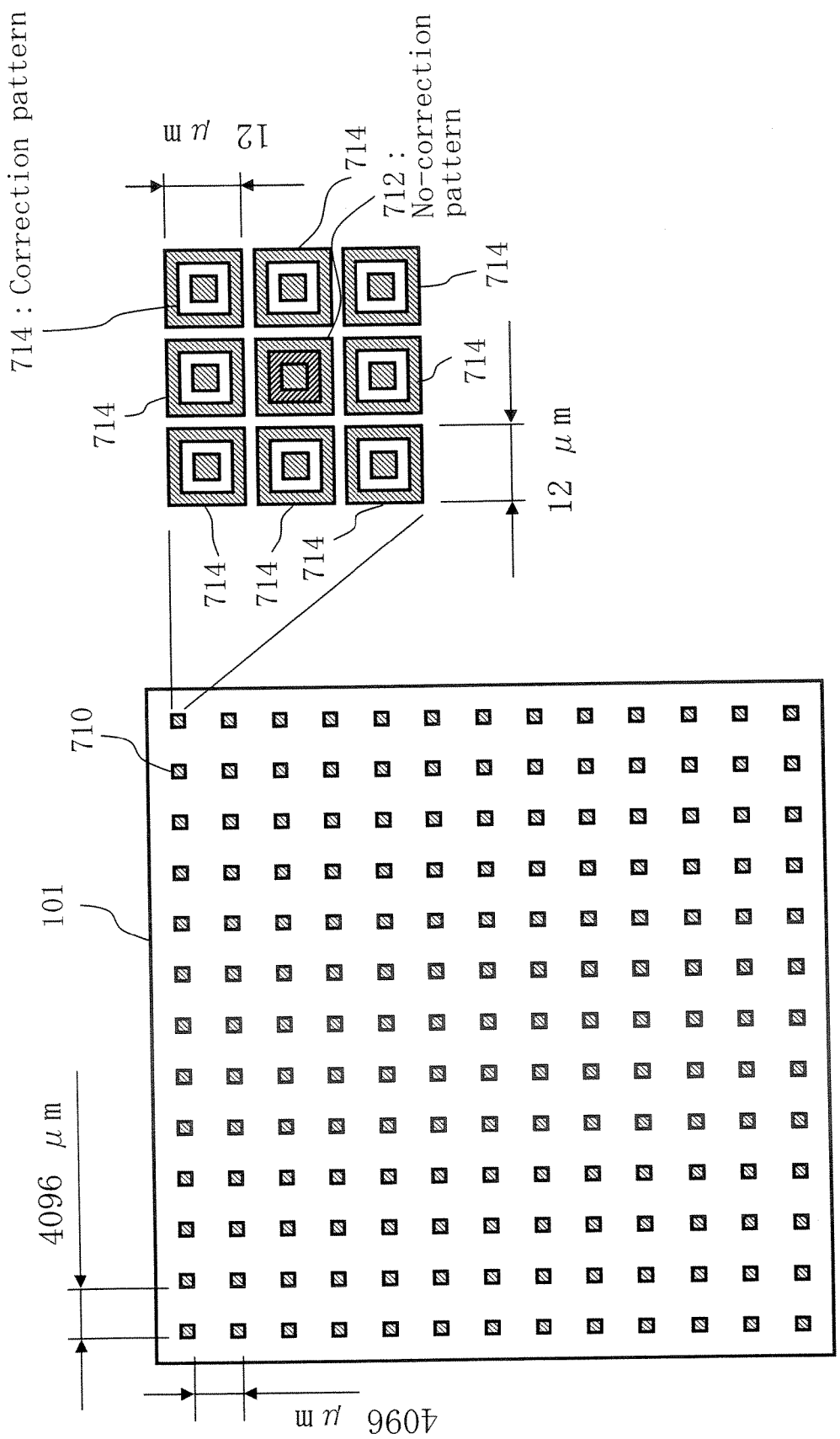
FIG. 14 shows an example of a test mask described in Embodiment 2.

When measuring and evaluating the position accuracy of an EUV mask, measuring using a test mask explained below is also preferable. FIG. 14 shows an example of the test mask described in Embodiment 2. First, as the backside shape measurement step as explained in Embodiment 1, the substrate backside topography, being the target workpiece 101 in the case of the influence of the gravity sag having been eliminated, is measured by using the flatness measuring apparatus 500.

Correcting a predicted positional deviation of a pattern written on the substrate frontside without correcting the substrate backside to be flat, such pattern is written on the frontside of the substrate. Then, around the pattern, another pattern is written in which a predicted positional deviation of the pattern, written on the substrate frontside when its backside having been corrected to be flat, is corrected. In other words, a no-correction pattern 712 (second pattern) using the default value 328 explained in Embodiment 1 and being in the case of the substrate backside being not corrected to be flat for the electrostatic chuck is written at the center of a pattern 710. Then, a correction pattern 714 (first pattern) using an additional value obtained by adding a coefficient to the default value 328 as a coefficient parameter is written so that the perimeter of the no-correction pattern 712 may be surrounded. A test mask is fabricated by writing a plurality of the patterns 710 on the mask at a predetermined pitch, by using the variable-shaped EB pattern writing apparatus 100 explained in Embodiment 1. By separately writing each of the two patterns respectively, such patterns of two kinds can be written.

Figure 15:
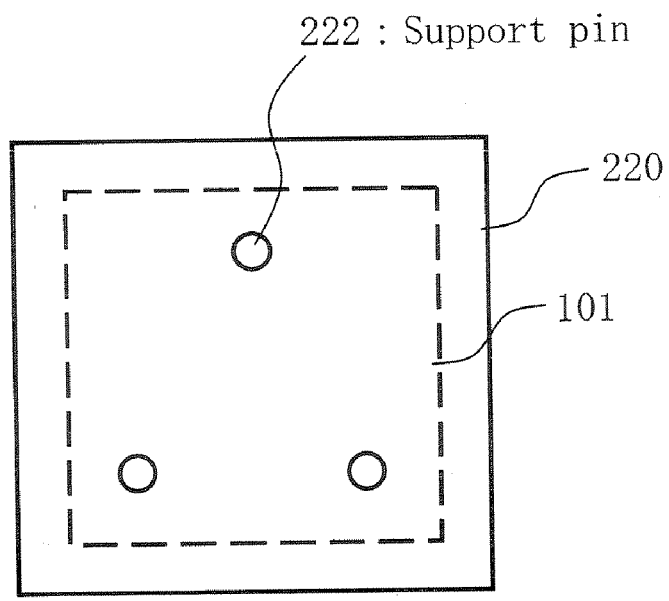
FIG. 15 is a schematic diagram showing an example of a structure of a three-point support member described in Embodiment 2.

FIG. 15 is a schematic diagram showing an example of a structure of the three-point support member. As shown in the figure, three support pins 222 are arranged in the three-point support member 220. The backside of the target workpiece 101 is supported by these three support pins 222. It is suitable for the support pin 222 to be composed of hard material, such as ruby and sapphire. Deformation of the support pin 222 at the time of laying the target workpiece 101 can be suppressed by using hard material to compose the support pin. Consequently, errors can be reduced and excellent reproducibility can be obtained.

Figure 16:
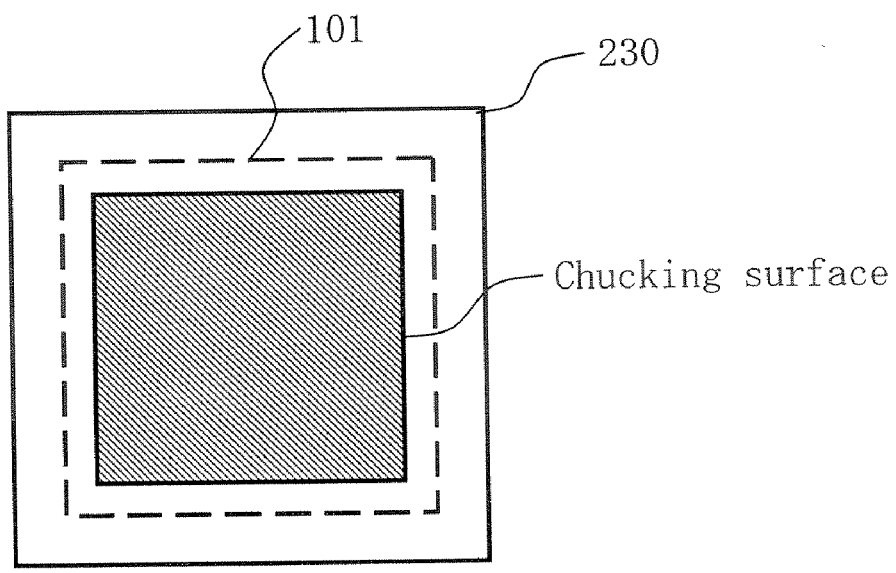
FIG. 16 is a schematic diagram showing an example of a structure of an electrostatic chuck member described in Embodiment 2.

FIG. 16 is a schematic diagram showing an example of a structure of an electrostatic chuck member. As shown in the figure, the chucking surface of the electrostatic chuck member 230 is formed to attract the whole backside surface except for the perimeter area of the target workpiece 101. Specifications of the chucking surface are specified in the SEMI standard as mentioned above.

As a first positional deviation amount measurement step, a positional deviation amount of the correction pattern 714 is measured in the state of the substrate backside being held by the electrostatic chuck. The correction pattern 714 is a pattern in which a predicted positional deviation amount of the pattern, written on the substrate frontside when its backside having been corrected to be flat, is corrected, based on the substrate backside topography.

Now, the operation of the position measuring apparatus 600 in the case of the pattern written on the EUV mask being printed onto a wafer will be explained. First, the transfer robot 640, using the hand 642, takes out the second set utilizing the electrostatic chuck from the holder 650, conveys it to the stage 620, and mounts it on the stage 620. Then, in the state of the electrostatic chuck member 230 being mounted on the stage 620, voltage is applied to the electrostatic chuck member 230 by the electrostatic chuck amplifier 672 through the stage 620. Thereby, the target workpiece 101 mounted on the electrostatic chuck member 230 is attracted and attached to the electrostatic chuck member 230 to be held by the chuck.

With keeping such state, the stage 620 is moved in the XY directions by the stage control circuit 674, and the correction pattern 714 is recognized by the pattern position recognition unit 610 to be imaged. Then, the imaged picture is sent to the calculator 660, with position information controlled by the position control system 622. The position of the correction pattern 714 is measured based on the imaged picture and the position information. By measuring the position of the correction pattern 714, a positional deviation from a desired position which is intended in the case of being held by the electrostatic chuck can be measured.

Next, as a second positional deviation amount measurement step, a positional deviation amount of the second pattern is measured, using the pattern 712, in the state of the substrate backside being supported at three points. As stated above, the pattern 712 is a pattern in which a predicted positional deviation of the pattern written on the substrate frontside in the state of its backside being not corrected to be flat is corrected.

Now, the operation of the position measuring apparatus 600 will be explained. First, the transfer robot 640, using the hand 642, takes out the second set utilizing the electrostatic chuck, which was previously conveyed, from the stage 620, and stores it in the holder 650. Then, the transfer robot 640, using the hand 642, takes out the first set utilizing the three-point support from the holder 650, conveys it to the stage 620, and mounts it on the stage. In the three-point support member 220 case, as the target workpiece 101 is just mounted on the three-point support member 220, the pattern position recognition part 610 images it in that state. The pattern position recognition part 610 recognizes and images the no-correction pattern 712 while the stage 620 moves in the XY directions by the stage control circuit 674. The imaged picture is sent to the calculator 660 with position information controlled by the position control system 622. Then, the position of the no-correction pattern 712 is measured based on the imaged picture and the position information. By measuring the position of the no-correction pattern 712, it is possible to measure a deviation amount from a desired position which is intended in the case of clamping three points by the clamp 210 of the variable-shaped EB pattern writing apparatus 100. That is, the accuracy of the pattern writing apparatus can be evaluated.

As to the orders of position measurement of the pattern 712 and the pattern 714, though measuring the position of the pattern 714 is performed first in the above, it is obviously acceptable whichever comes first.

As described above, both of the pattern groups, a group of patterns in the case of the backside surface being corrected and a group of patterns in the case of the backside surface being not corrected, are written on one mask. Then, by performing measurement by selectively using a three point support method or an electrostatic chuck depending upon cases, it is possible to efficiently evaluate whether any pattern degradation caused by performing correction has arisen or not. Moreover, when the three-point support method with excellent reproducibility of the substrate holding being used, it is possible to check whether the no-correction pattern 712 is written with desired accuracy or not. As to the correction pattern 714, when the electrostatic chuck being used, it is possible to evaluate whether the corrected coordinates are accurately obtained in the state of actually being held by the chuck or not. That is, checking the position accuracy of both of the pattern corrected on the assumption of being held by the electrostatic chuck and the pattern not corrected can be performed. As to the test mask, it is acceptable to prepare a plurality of test masks, and to store beforehand as a set of test masks laid on the electrostatic chuck member 230 and a set of test masks laid on the three-point support member 220, in the holder 650. Alternatively, it is also acceptable to use one test mask to measure, laying it on the electrostatic chuck member 230 or relaying it on the three-point support member 220.

Moreover, in the position measuring apparatus 600 of Embodiment 2, it is possible to respectively measure an EUV mask or another type mask (for example, optical mask mentioned above). When measuring a position of a pattern assumed in the case of the EUV mask being printed by an exposure apparatus (transfer apparatus), it may be mounted on the electrostatic chuck member 230. When measuring a position of a pattern assumed in the case of a mask except for the EUV mask being printed by an exposure apparatus, it may be mounted on the three-point support member 220. Since a mask which is not an EUV mask is not held by the electrostatic chuck when arranged for the exposure apparatus, meaning its backside surface has not been corrected, it is preferable for it to set the same conditions when measuring the position. As mentioned above, when the position measuring apparatus 600 of Embodiment 2 is used, it is possible to check the position accuracy of both of the pattern whose backside surface being corrected by the electrostatic chuck and being exposed, and the pattern being exposed without the backside correction.

EMBODIMENT 3

In Embodiment 2, a test mask with at least two kinds of test pattern is prepared for evaluating position accuracy of a mask pattern written by a mask pattern writing apparatus capable of executing a positional deviation correction highly accurately with sufficient reproducibility, based on the topography information on the substrate backside, and evaluating writing performance of the mask pattern writing apparatus obtained based on the written mask.

One test pattern group is measured by a measuring apparatus which eliminates the influence of the mask gravity sag from the substrate backside topography before writing JOB registration and is not provided in the pattern writing apparatus. In this case, a positional deviation amount of the pattern is calculated based on the backside shape information peculiar to the substrate, and is read as one of parameters peculiar to the substrate at the time of writing registration. In this way, the deviation amount of the test pattern group mentioned above is corrected.

Another test pattern group is for a pattern written as a usual optical mask in which positional deviation correction based on the above-stated backside shape is not performed. In the pattern of this kind, it is possible to give a different parameter to each of eight surrounding pattern groups. In these eight pattern groups, even if writing is performed with conditions changing, it is enough to write by only dividing depending upon the kind of conditions. Then, when evaluating the test pattern group of the correction pattern 714, the position accuracy is evaluated in the state of the substrate being held by the electrostatic chuck. When evaluating the test pattern group of the no-correction pattern 712, position accuracy is evaluated in the state of the substrate being held by the three-point support method.

In Embodiment 3, both the pattern groups are evaluated by a position accuracy evaluation apparatus which employs the method of holding the substrate by the three-point support. Since the apparatus structure and the structure of a test mask may be the same as those in Embodiment 2, explanation for them is not described here.

According to the method of Embodiment 3, it is possible to check whether a pattern without correction is written at a desired accuracy using the three-point support method which holds a substrate with excellent reproducibility. Moreover, as to a test pattern being corrected, it is possible to predict a pattern positional deviation amount caused by a backside surface correction, by comparing a writing pattern intentionally corrected with an actual pattern.

As mentioned above, by properly using the position accuracy evaluation apparatus that can select the electrostatic chuck or the three-point support method depending upon the situation, an efficient evaluation in accordance with the object can be acquired.

EMBODIMENT 4

In Embodiment 4, a pattern writing apparatus or a writing method some of which is different from those in Embodiment 1 will be explained. When writing an EUV mask in Embodiment 4, the respects that measuring is performed with eliminating the influence of the mask gravity sag from the substrate backside topography before writing JOB registration and that a measuring apparatus which is not provided in the pattern writing apparatus is used are the same as Embodiment 1. In addition, topography data of the electrostatic chuck to be used is prepared beforehand as a parameter. Then, based on the topography data of the electrostatic chuck to be used for a mask, a pattern positional deviation amount of the substrate frontside at the time of the substrate being held by the electrostatic chuck is calculated from the difference of the topography data on the substrate backside and the topography data on the electrostatic chuck. Such positional deviation amount is read as one of parameters peculiar to the substrate at the time of writing registration, in order to correct a positional deviation amount. As to a substrate holding method, the mechanical three-point support method by which a substrate can be held with sufficient reproducibility is used as an established technique. Hereafter, it will be explained with reference to figures.

Figure 17:
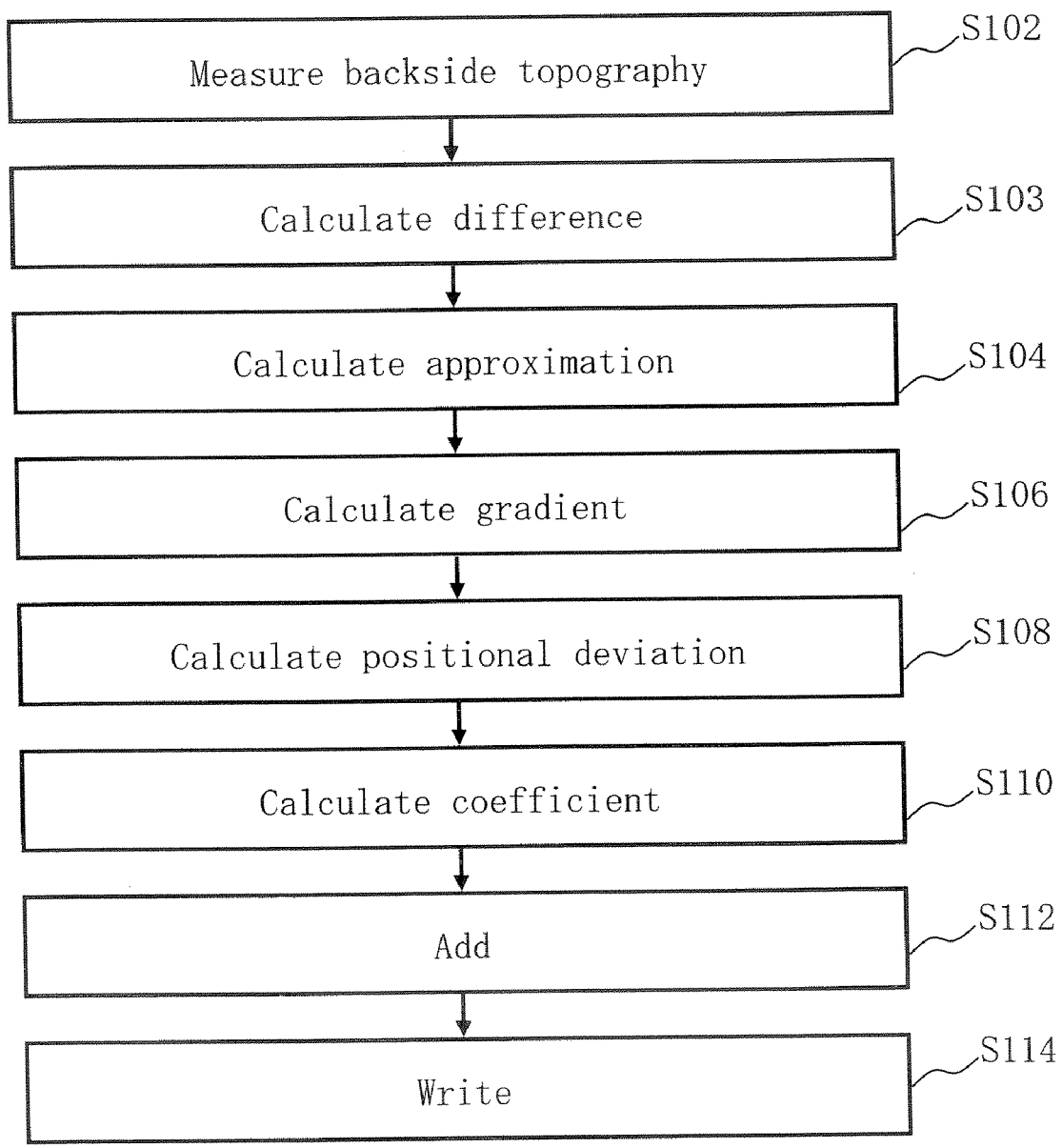
FIG. 17 is a flow chart showing main steps of an electron beam writing method described in Embodiment 4.

FIG. 17 is a flow chart showing main steps of an electron beam writing method described in Embodiment 4. As shown in the figure, a series of steps of a backside shape measurement step (S102), a difference calculation step (S103), an approximation calculation step (S104), a gradient calculation operation (S106), a positional deviation amount calculation step (S108), a coefficient calculation step (S110), an addition step (S112), and a writing step (S114) are executed in the electron beam writing method. Except for the respect that the difference calculation step (S103) is added, others are the same as those in FIG. 1.

Figure 18:
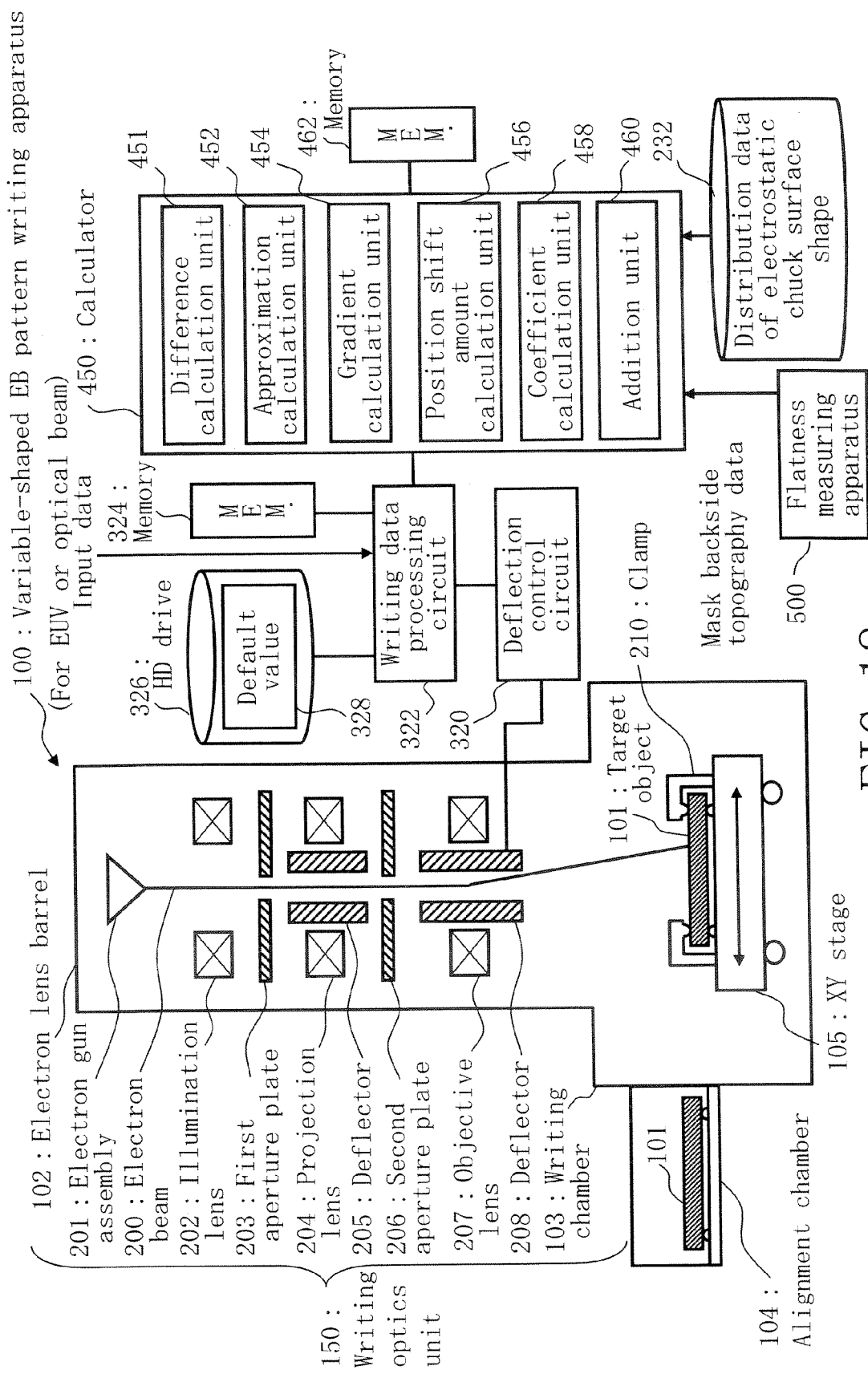
FIG. 18 is a schematic diagram showing a structure of a pattern writing apparatus described in Embodiment 4.

FIG. 18 is a schematic diagram showing a structure of the pattern writing apparatus described in Embodiment 4. In the variable-shaped EB pattern writing apparatus 100 shown in FIG. 18, respects except for that a difference calculation unit 451 is added in the calculator 450 and distribution data 232 of an electrostatic chuck surface shape is input into the calculator 450 are the same as those in FIG. 2.

Structure elements required for describing Embodiment 4 are illustrated in FIG. 18, and it is also acceptable other structure elements usually needed for the variable-shaped EB pattern writing apparatus 100 are included. Moreover, processing of each function, such as the difference calculation unit 451, the approximation calculation unit 452, the gradient calculation unit 454, the positional deviation calculation unit 456, the coefficient calculation unit 458, and the addition unit 460 is performed in the calculator 450 serving as an example of a computer in FIG. 18. However, it is not restricted to this. It is also acceptable to execute it by hardware of an electric circuit. Alternatively, it may be executed by combination of hardware and software, or combination of hardware and firmware.

The case of writing an EUV mask will be explained below. In S102, as a backside shape measurement step, the substrate backside topography being the target workpiece 101 in the case of eliminating the influence of gravity sag is measured using the flatness measuring apparatus 500 in the outside of the variable-shaped EB pattern writing apparatus 100. This step is the same as that of Embodiment 1.

Figure 19:
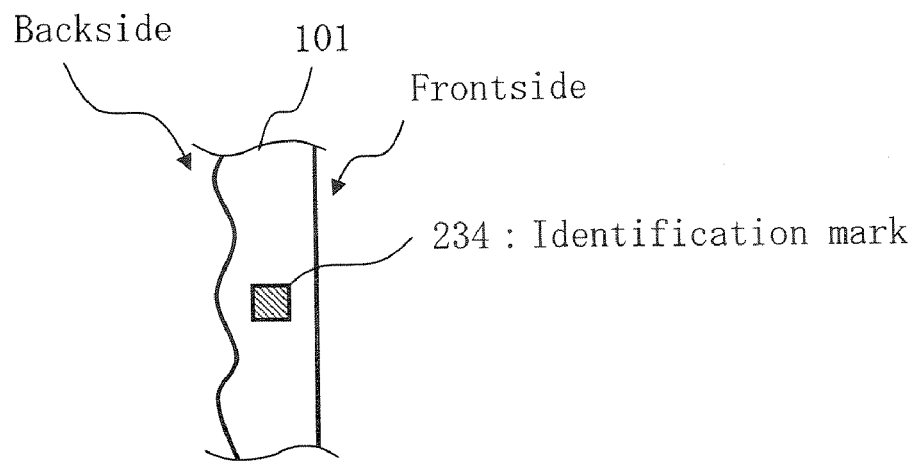
FIG. 19 is a schematic diagram showing a part of side of a target workpiece described in Embodiment 4.

FIG. 19 is a schematic diagram showing a part of side of the target workpiece described in Embodiment 4. In the figure, even if the influence of the gravity sag is eliminated in the target workpiece 101, other deformation peculiar to the substrate arises in the backside as stated above. An identification mark 234 for identifying the target workpiece 101 is formed. The position where the identification mark 234 is formed is not restricted to the side, and any position is acceptable as long as the mark is formed in the area unrelated to the original mask writing pattern.

Figure 20:
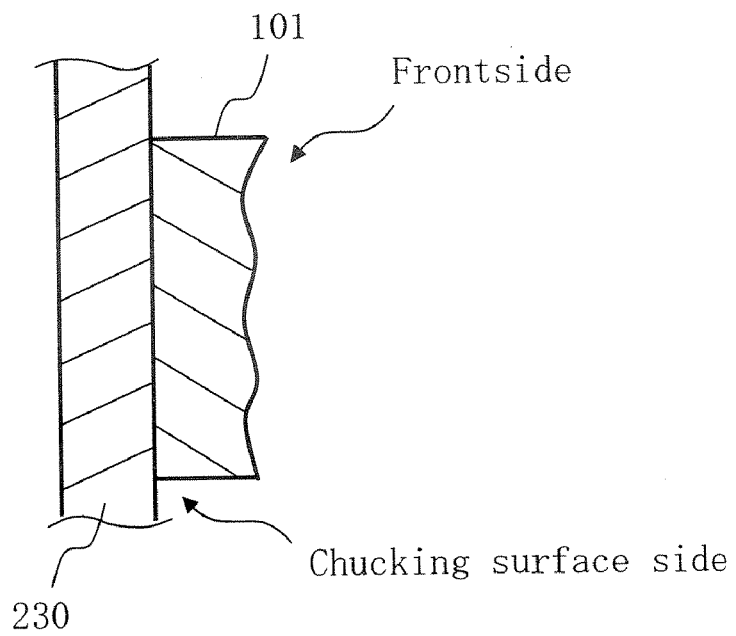
FIG. 20 is a schematic diagram showing a part of section of a target workpiece held by an electrostatic chuck with an ideal chuck surface described in Embodiment 4.

FIG. 20 is a schematic diagram showing a part of a section of the target workpiece held by the electrostatic chuck with an ideal chuck surface described in Embodiment 4. As shown in the figure, when being held by the electrostatic chuck with the ideal flat surface, a substrate frontside deforms based on deformation of the backside shape of the target workpiece 101. In Embodiment 1, it is described that positional deviation correction is performed on the assumption of being held by the electrostatic chuck with a chuck surface of an ideal flat. In addition to this point of Embodiment 1, the case of taking the shape of an electrostatic chuck into consideration will be explained in Embodiment 4.

Figure 21:
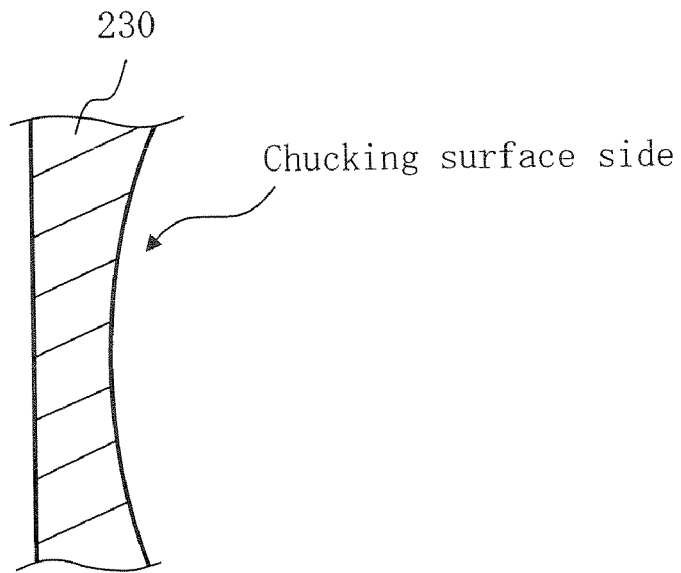
FIG. 21 is a schematic diagram showing an example of section of an electrostatic chuck described in Embodiment 4.
Figure 22:
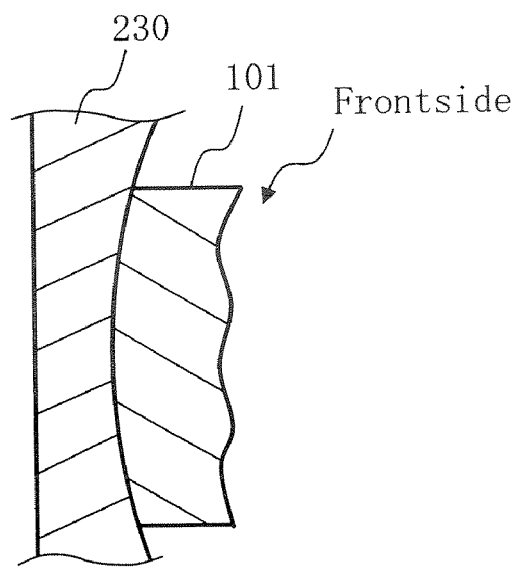
FIG. 22 is a schematic diagram showing a part of section of a target workpiece held by the electrostatic chuck with the chuck surface shown in FIG. 21.

FIG. 21 is a schematic diagram showing an example of a section of the electrostatic chuck in Embodiment 4. FIG. 22 is a schematic diagram showing a part of a section of the target workpiece held by the electrostatic chuck with the chuck surface shown in FIG. 21. As shown in FIG. 21, the chuck surface of the electrostatic chuck member 230 is not necessarily formed to be an ideal flat surface. If the target workpiece 101 is held by such chuck surface of the electrostatic chuck member 230, as shown in FIG. 22, the frontside of the substrate used as the target workpiece 101 will be influenced by the shape of the chuck surface of the electrostatic chuck member 230.

In S103, as a difference calculation step, first the calculator 450 inputs shape distribution data of height distribution etc. of the substrate backside measured by a flatness measuring apparatus. Furthermore, the calculator 450 inputs electrostatic chuck surface shape distribution data indicating a topography of the chuck surface of the electrostatic chuck member 230 used by a position measuring apparatus or an exposure apparatus. The shape distribution data and the electrostatic chuck surface shape distribution data which have been input may be stored in the memory 462. Alternatively, the electrostatic chuck surface shape distribution data may be stored beforehand at a position which can be referred to. The difference calculation unit 451 reads shape distribution data of the substrate backside and distribution data of an electrostatic chuck surface shape from the memory 462. Then, a difference value between the height shape, along the thickness T of the substrate, indicated by the shape distribution data of the substrate backside and the height shape, along the thickness T of the substrate, indicated by the distribution data of the electrostatic chuck surface shape is calculated. By subtracting the electrostatic chuck data from the data of height-direction-axis of the mask substrate, data of height-direction-axis of the mask substrate of the electrostatic chuck reference can be obtained. In other words, it is possible to perform offset of the reference plane for each electrostatic chuck.

In S104, as an approximation calculation step, the approximation calculation unit 452 carries out fitting (approximation) of the shape distribution of the acquired difference value by the fourth polynomial, for example. Since the operations up to the writing step are the same as those in Embodiment 1, explanations for them are not described herein.

As mentioned above, by using shape distribution of a difference value between shape distribution data of a substrate backside and distribution data of an electrostatic chuck surface shape, it is possible, based on the shape information of the electrostatic chuck to be used, to previously correct the position accuracy of a pattern to be written in accordance with the shape of the electrostatic chuck to be used.

Moreover, since the identification mark 234 for identifying a pattern writing apparatus which wrote a pattern on the EUV mask is formed in advance, for example on the side of a substrate, it is possible to identify the substrate used for each pattern writing apparatus. This identification mark 234 can be detected by a camera etc. provided, for example, in a carrier system (not illustrated) of an exposure apparatus. Thereby, it is possible to identify whether the substrate is written by a mask writing apparatus including a backside correction function, for example, or not.

Furthermore, since the shape of an electrostatic chuck surface differs depending upon an exposure apparatus, the writing apparatus which wrote the pattern on the EUV mask can be identified by the identification mark 234. Thereby, it is possible to identify which exposure apparatus provided electrostatic chuck surface data to be used for the correction by the pattern writing apparatus.

According to any of the Embodiments mentioned above, even if an electrostatic chuck is not used in a pattern writing apparatus, a pattern positional deviation expected to generate in the case of using an electrostatic chuck can be accurately corrected. In other words, by using the conventional three-point support method with sufficient reproducibility, a pattern positional deviation expected to generate in the case of using an electrostatic chuck can be accurately corrected. Consequently, it is possible to contribute to improvement in transfer precision in the case of holding a mask by the electrostatic chuck at the time of EUV exposure.

EMBODIMENT 5

Since an EUV mask is held by an electrostatic chuck in the exposure apparatus, the mask needs to have flatness equivalent to that of the electrostatic chuck. According to "Table 1" of "SEMI P40-1103" mentioned above, it is specified that flatness of 50 nm or less is needed in all the surfaces of a mask blank. The case where surface flatness of the frontside and backside of the target workpiece 101 serving as a blank of an EUV mask is insufficient has been described in Embodiment 1 and Embodiment 4. In specifications for EUV mask blanks, a substrate with flatness of 30 nm or less and thickness unevenness of 30 nm or less which is equivalent to "Class D", for example, shown in "Table 4" of "SEMI P37-1102" can be regarded as an ideal flat surface. Currently, in the specifications of "SEMI P37-1102", a gradient of 100 µm as a "Wedge" is permitted as a substrate. However, in recent years, there is also an argument that it is necessary to make thickness unevenness small. When the thickness unevenness of a mask blank is extremely small, it can be considered that the mask blank frontside and backside are parallel planes. Thus, when flatness and thickness unevenness are 30 nm or less, for example, it is possible to calculate a deformation amount of the backside and a deformation amount of the pattern caused by the deformation, by measuring the frontside shape of a blank of an EUV mask to be used. Thus, in Embodiment 5, using a substrate considered to have such parallel planes, a writing method of utilizing a result of measurement of the frontside shape being held by the three-point support will be explained.

Figure 23:
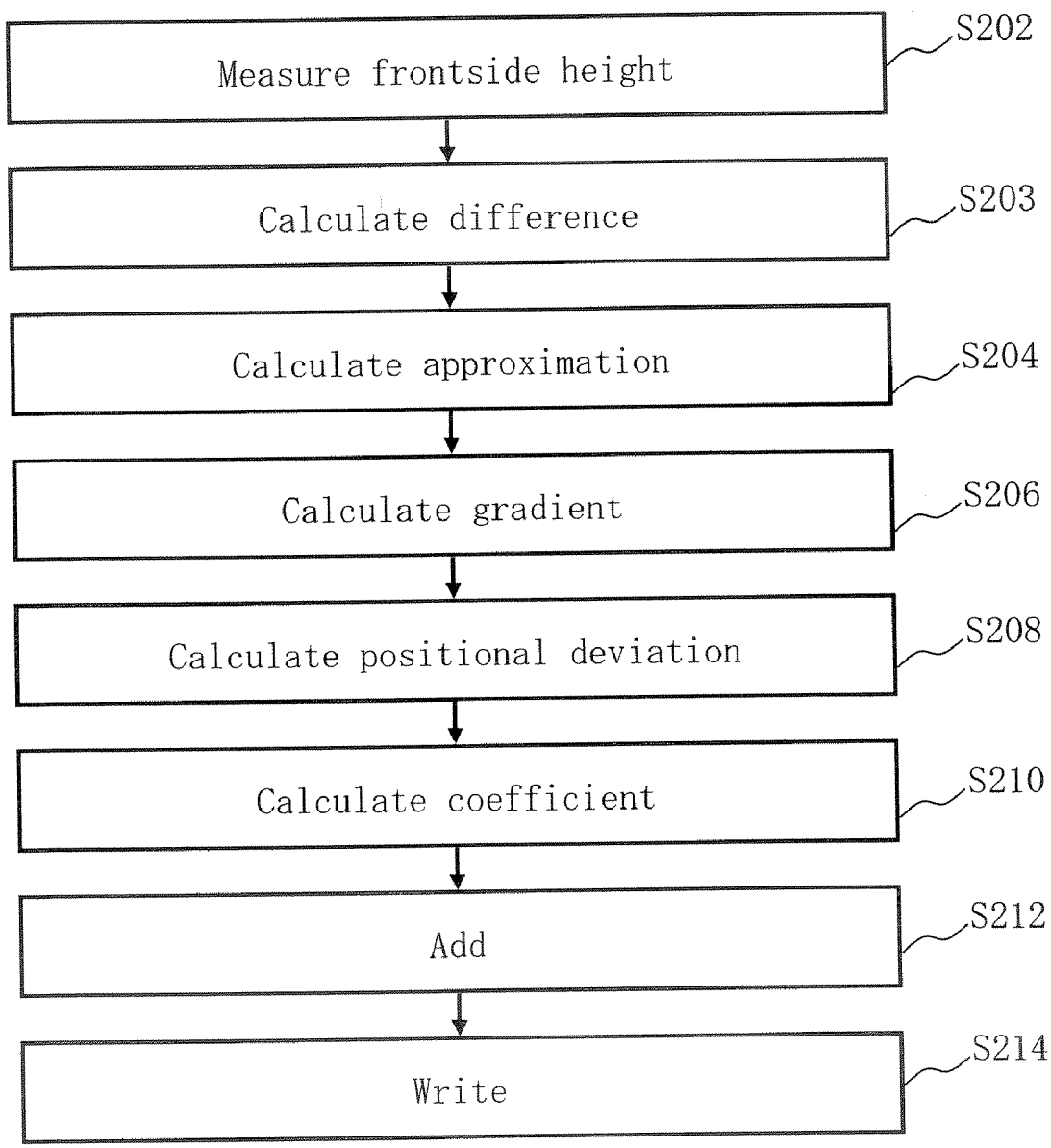
FIG. 23 is a flow chart showing main steps of an electron beam writing method described in Embodiment 5.

FIG. 23 is a flow chart showing main steps of an electron beam writing method described in Embodiment 5. As shown in the figure, a series of steps of a frontside height measurement step (S202), a difference calculation step (S203) an approximation calculation step (S204), a gradient calculation operation (S206), a positional deviation amount calculation step (S208), a coefficient calculation step (S210), an addition step (S212), and a writing step (S214) are executed in the electron beam writing method.

Figure 24:
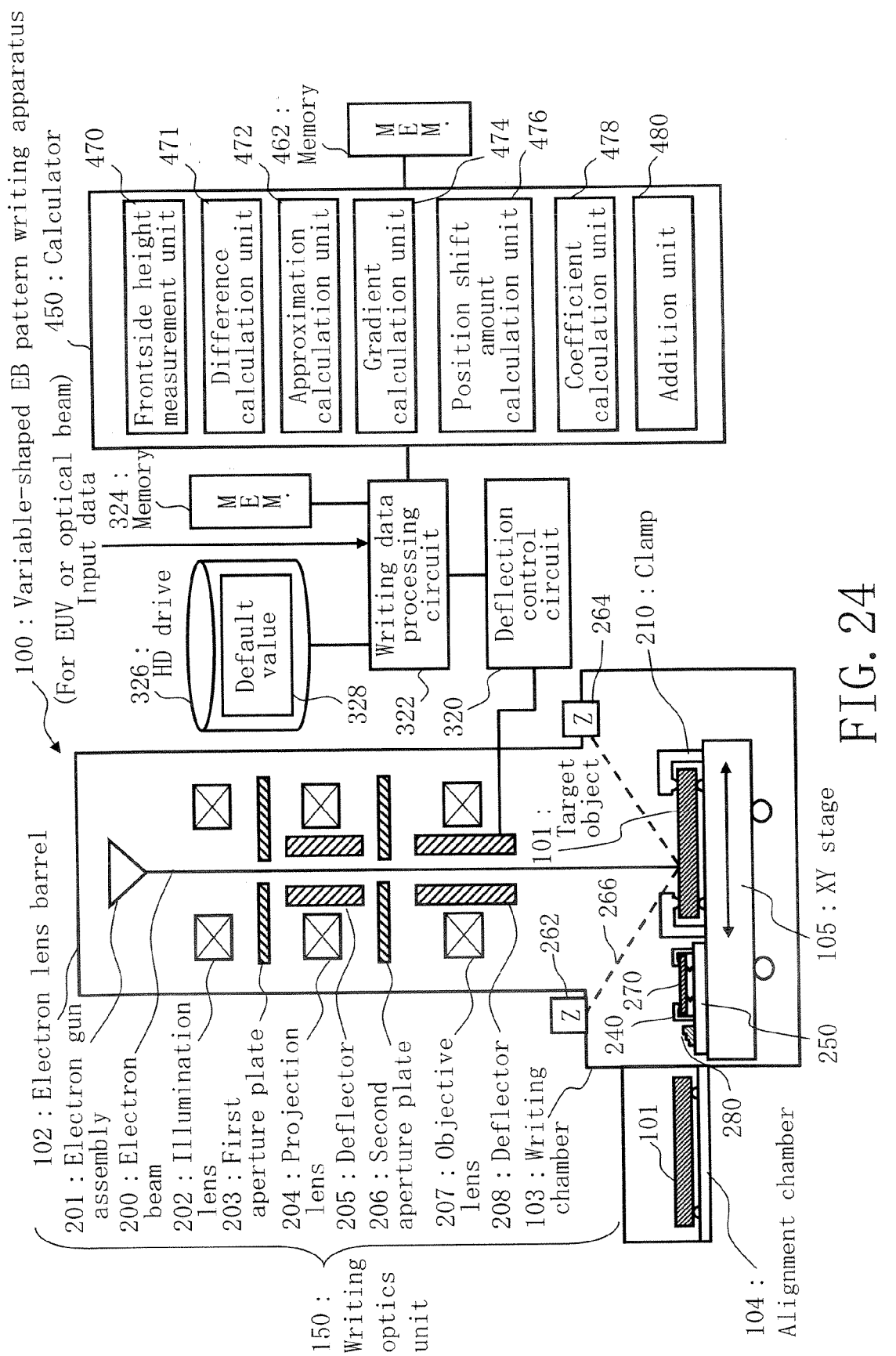
FIG. 24 is a schematic diagram showing a structure of a pattern writing apparatus described in Embodiment 5.

FIG. 24 is a schematic diagram showing a structure of a pattern writing apparatus described in Embodiment 5. In the figure, in addition to the structure elements in FIG. 2, the writing area 150 includes a reference chip 270, a clamp 240, a step member 280, a mark table 250, a phototransmitter 262, and a photoreceiver 264. As a control unit, functions of a frontside height measurement unit 470, a difference calculation unit 471, an approximation calculation unit 472, a gradient calculation unit 474, a positional deviation amount calculation unit 476, a coefficient calculation unit 478, and an addition unit 480 are included in the calculator 450. Other structure elements are the same as those in FIG. 2. The mark table 250 is arranged on the XY stage 105. The reference chip 270 being an example of a reference member held by the clamp 240 is arranged on the mark table 250. Moreover, on the mark table 250, the step member 280 is arranged near the reference chip 270. The phototransmitter 262 and the photoreceiver 264 are arranged near upper surface of the writing chamber 103 so that they may bookend the electron lens barrel 102. If a PSD (Position Sensitive Detector) is mounted, for example, it is suitable for the photoreceiver 264. A laser light 266 irradiated from the phototransmitter 262 is applied to the target workpiece 101 used as a substrate, the reference chip 270, or the step member 280. Then, the laser light 266 reflected is received by the photoreceiver 264, and the position of direction of Z-axis (height-direction-axis, or "heightwise") is measured. The photoreceiver 264 expands the reflected light and leads it to the PSD. In this way, an optical lever type measurement sensor is composed of the phototransmitter 262 and the photoreceiver 264. The sensor measures a height of the frontside of the target workpiece 101, such as a mask blank, near the place onto which the electron beam 200 is irradiated and deflected, in a non-contact state.

Structure elements required for describing Embodiment 5 are illustrated in FIG. 24, and it is also acceptable other structure elements usually needed for the variable-shaped EB pattern writing apparatus 100 are included. Moreover, processing of each function, such as the frontside height measurement unit 470, the difference calculation unit 471, the approximation calculation unit 472, the gradient calculation unit 474, the positional deviation calculation unit 476, the coefficient calculation unit 478, and the addition unit 480 is performed in the calculator 450 serving as an example of a computer, in FIG. 24. However, it is not restricted to this. It is also acceptable to execute it by hardware of an electric circuit. Alternatively, it may be executed by combination of hardware and software, or combination of hardware and firmware.

Figure 25:
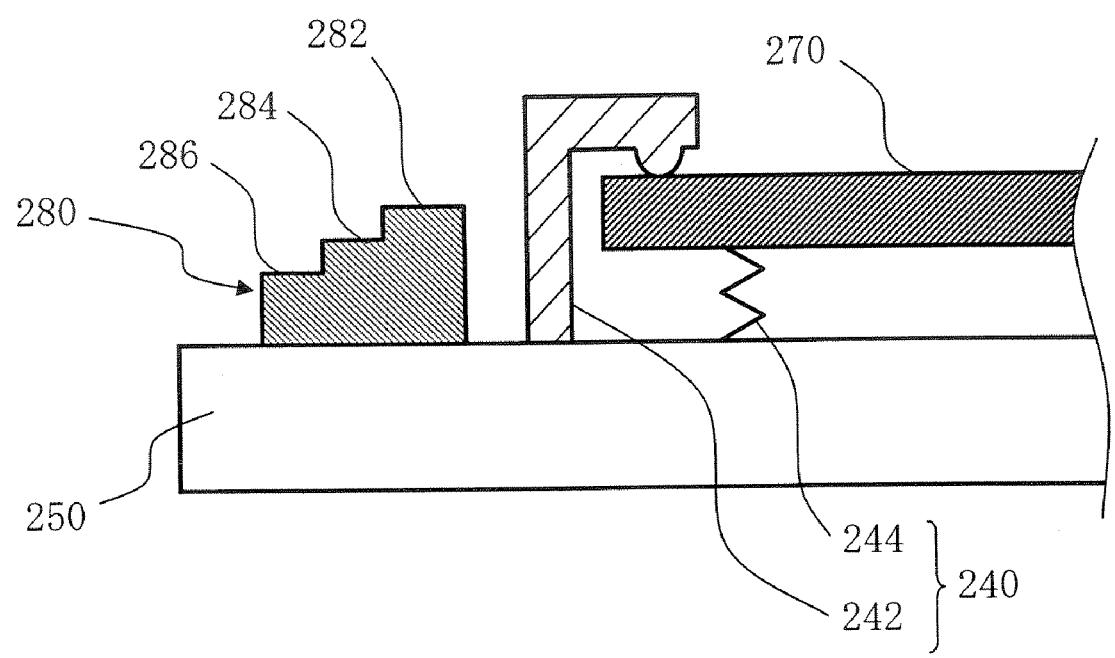
FIG. 25 is a sectional schematic diagram showing an example of a state of holding a reference chip described in Embodiment 5.

FIG. 25 is a sectional schematic diagram showing an example of a state of the reference chip holding described in Embodiment 5. The clamp 240 includes an upper surface reference piece 242 and a support member 244. It has a structure of catching the reference chip 270 from the frontside by the upper surface reference piece 242, and from the backside by the support member 244, namely clamping the same axis from the upper and the lower sides. Since the support member 244 is composed of a spring member, the reference chip 270 can be caught and fixed without raising the upper surface reference piece 242. Therefore, it is possible to accurately adjust the height position of the frontside of the reference chip 270 to a desired height position. The step member 280 has more than one planes or "surfaces" at the upper side, each of which has different height position. For example, three planes 282, 284, and 286 are shown in FIG. 25, and step differences are formed by them. Since the step member 280 is arranged near the electron beam, it needs to be composed of metal having conductivity or material with frontside gilded, for example.

The difference between the height of the frontside of the reference chip 270 and the height of the frontside of a mask blank is adjusted to be sufficiently smaller than a measuring range of a measurement sensor being an assembly composed of the phototransmitter 262 and the photoreceiver 264. This adjustment can be adjustable depending upon the height of the mark table 250 attached to the XY stage 105, for example. The height of the frontside of the reference chip 270 is a height in a state of fixing the reference chip 270 by using the clamp 240. Moreover, the height of the frontside of the mask blank used as the target workpiece 101 is a height in a state of contacting the upper surface of the upper surface reference piece 212 and being held by the clamp 210. When measuring the height of the frontside, it is suitable to use a lever-type sensor as shown in FIG. 24 being an assembly composed of the phototransmitter 262 and the photoreceiver 264. The optical lever sensor can highly accurately measure a position of the mask blank frontside, by magnifying and detecting deviation at the image focus location of the laser light 266 reflected by the mask blank frontside. If this optical lever sensor is used, an about 100 µm measurement range can be obtained under the restrictions on the machine design. On the other hand, the difference between the height of the reference chip 270 frontside and the height of the mask blank frontside can be adjusted to be 10 μm or less by a mechanical adjustment means. The value of 10 μm or less is a sufficiently small value even if height change caused by deflection of a mask blank or a peculiar shape (flatness) and other errors are added to the value.

Figure 26:
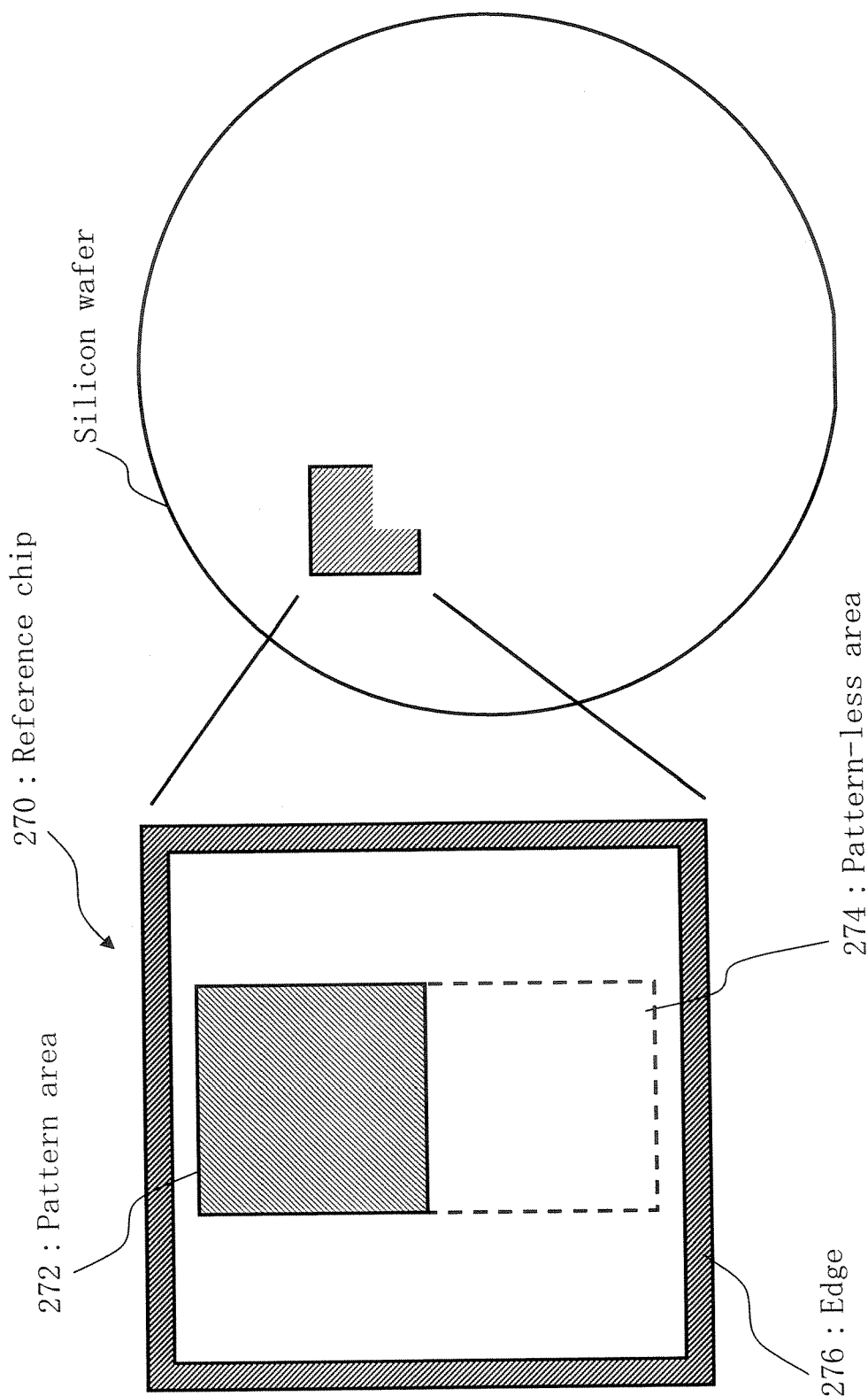
FIG. 26 is a schematic diagram showing an example of a reference chip described in Embodiment 5.
Figure 27:
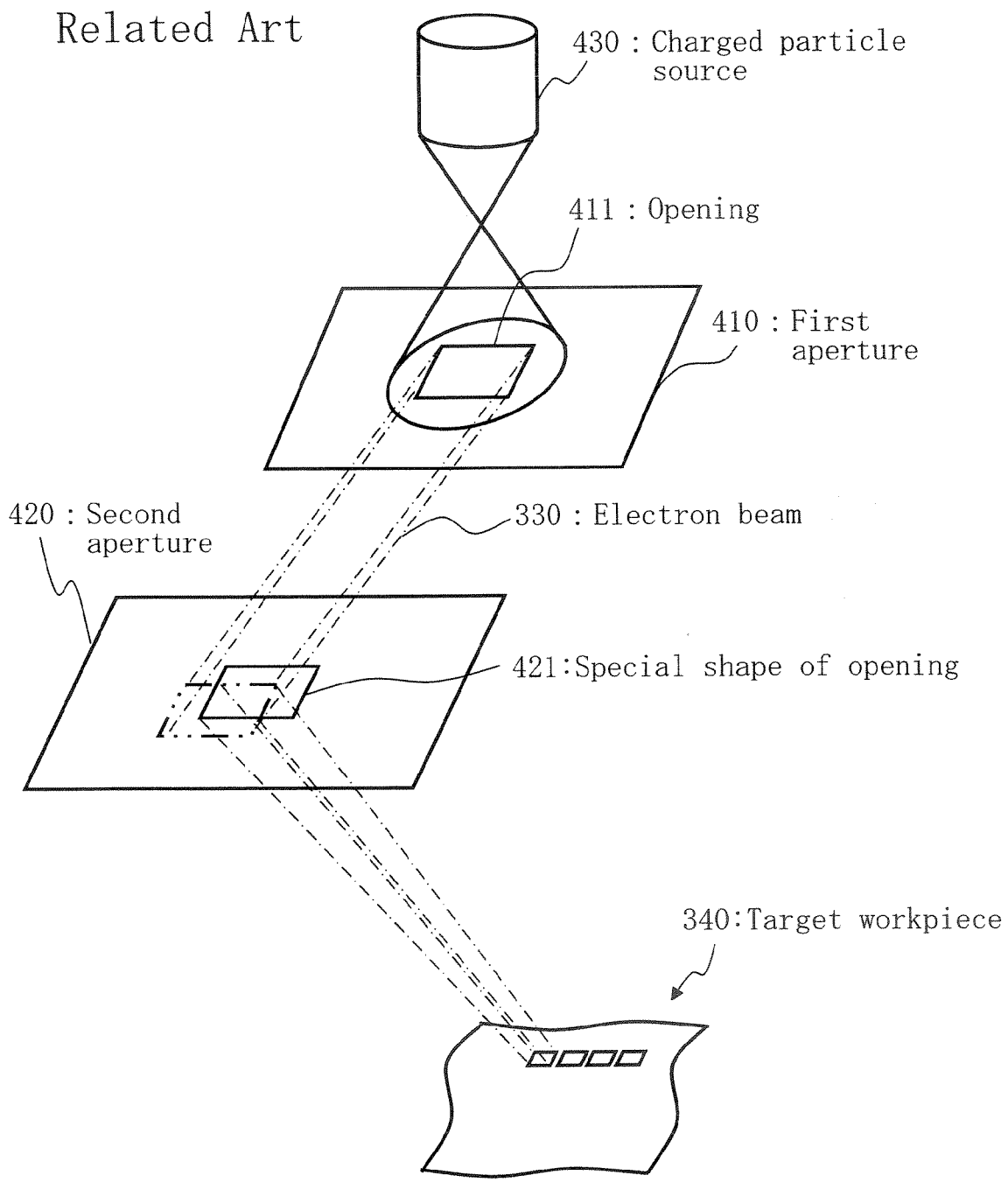
FIG. 27 is a schematic diagram for explaining operations of a conventional variable-shaped electron beam pattern writing apparatus.

FIG. 26 is a schematic diagram showing an example of a reference chip described in Embodiment 5. As shown in the figure, the reference chip 270 is composed of a chip cut from a silicon substrate (silicon wafer). For example, it is composed of a chip of a 10 to 14 mm square. The reference chip 270 includes a pattern area 272, a pattern-less area 274, and an edge 276. A mark used when the pattern writing apparatus 100 performs calibration etc. is formed in the pattern area 272 as a pattern. It is preferable to form a pattern using heavy metal, such as tungsten (W) and tantalum (Ta) on the original substrate which is a silicon wafer. By scanning this mark pattern with the electron beam 200, measurement data of a reflective electron or a secondary electron can be obtained with a preferable contrast as a two-dimensional profile. Based on the two-dimensional profile of the mark pattern, it is possible to make a positional coordinate of the electron beam 200 be a positional coordinate reference of the position of the XY stage 105. The position of the XY stage 105 is measured by a position measurement means, such as a laser interferometer (not illustrated) etc. The edge 276 of a frame shape is an area for catching and fixing the reference chip 270 by the clamp 240. It is also acceptable to form another pattern, such as a rectangle pattern, in the other area.

Deflection scanning is applied to the electron beam 200 by the deflector 208 etc. Since the electron beam 200 is irradiated onto the target workpiece 101 with a certain angle, if the height of the target workpiece changes, the deflection area changes. For example, if deflection is performed at a position 0.2 m above the surface of the target workpiece 101 with an opening angle of 5 mrad, the deflection area becomes a 1 mm square. That is, when the height of the target workpiece 101 changes by 0.2 μm, the deflection area changes by 1 nm. Since the optical lever sensor mentioned above has resolution of 0.1 μm or less, it is possible to highly accurately measure the change of the deflection area accompanied by the change of the height of the mask blank used as the target workpiece 101.

The optical lever sensor acquires position information by detecting a light reflected by the target workpiece 101 surface, by using a PSD. Since the mask blank has no pattern, it has no problem even if the height is measured during writing. If a pattern etc. exists on the target workpiece 101, since an incident laser light is diffusely reflected by the edge part of the pattern and sufficient light cannot be obtained, a problem in measuring the height arises. Therefore, when measuring a height on the reference chip 270 by using an optical lever sensor, it is desirable to use the pattern-less area 274 in which no pattern is formed. Thereby, sufficient light can be acquired and measurement can be performed with no problems.

Gilded metal surface has a reflection ratio of 80% or more to a red laser light used for general-purpose, for example. However, in the usual mask blank, since an antireflection film which suppresses the reflection ratio of visible lights is applied, only the reflection ratio of 40% or less is obtained to the red laser light mentioned above. On the other hand, sensitivity at the PSD side has an uppermost limit to the strength of a light reflected by the target workpiece 101 surface. Therefore, it is necessary to be in accordance with a strong light, i.e., the light of the reflection ratio of 80% or more, in order that the sensitivity at the PSD side may not overflow. That is, it needs to be in accordance with a surface of the step member 280 having a high reflection ratio. However, in the case of the mask blank, which has a reflection ratio of only about 20 to 40% being the ratio actually used, there is a possibility of having insufficient sensitivity. Therefore, in Embodiment 5, applying coating of a chromium film and an antireflection film to the planes 282, 284, and 286 of the step member 280, the reflection ratio of the planes 282, 284, and 286 of the step member 280 is made to be the same as that of the reference chip 270 or a mask blank. Thereby, the sensitivity at the PSD side can be in accordance with the light of the reflection ratio of about 40% being the reflection ratio of the mask blank. Therefore, it becomes possible to enhance the effective sensitivity at the PSD side at the time of measuring the height position of the mask blank.

It is suitable for the size of each plane of the step member 280 to be larger than the spot diameter of the optical lever sensor, for example, about 500 μm×2000 μm. It is preferable for each of the step differences between the planes of the step member 280 to be formed at 10 μm pitch, for example. By performing highly precise machining process, etc., it is possible to fabricate the step member 280 with shape accuracy of about 1 μm processing error. As for the step differences, it is preferable to measure them before being incorporated in the apparatus, using a reliable measuring instrument which is more precise than the optical lever sensor. By using the planes 282, 284, 286 of the step member 280 whose step difference amounts (height position differences) are known in the above fabrication method, the relation between the step difference amount and a measuring value is calculated. Thereby, the gain of the optical lever sensor can be adjusted.

Then, in the case of using the pattern writing apparatus 100, firstly, the relation between the step difference amount and a measuring value, i.e., a gain, in the optical lever sensor is calculated using the step member 280 provided near the reference chip 270. Since the step difference amount of the step member 280 has already been measured in advance, its value can be used. Then, using the optical lever sensor whose gain has already been calculated, the height of the pattern-less area 274 of the reference chip 270 is measured. Deflection adjustment (calibration), etc. of the electron beam 200 is performed using the pattern of the pattern area 272 adjacent to the pattern-less area 274 on the reference chip 270. Even if the height changes because of deflection, etc. of the mask blank afterward, by using the height reference or "criterion" of the pattern-less area 274, the optical lever sensor can measure the height near the irradiation position of the electron beam 200.

Therefore, it becomes possible to retain the highly accurate writing precision by correcting the deflection error generated by a height difference. The method of correcting the positional deviation amount will now be explained below.

In S202, as a frontside height measurement step, the frontside height measurement unit 470 measures the position of the mask blank frontside serving as a substrate (target workpiece 101), using the optical lever sensor composed of the phototransmitter 262 and the photoreceiver 264. Performing virtual division for at least inside of the flatness precision assurance area to be a matrix of 7×7, each point is measured highly accurately. Ideally, in the electrostatic chuck used after writing, in the exposure apparatus, it is preferable to measure at a pitch equal to or smaller than the distance between the attached substrate and the support portion contacting and supporting the attached substrate.

In S203, as a difference calculation step, the difference calculation unit 471 calculates a difference between the height value of the measured substrate surface and the height value of the pattern-less area 274 being reference.

In S204, as an approximation calculation step, the approximation calculation unit 472 performs fitting of shape data of the substrate frontside based on the obtained difference, by using the fourth order polynomial.

In S206, as a gradient calculation step, the gradient calculation unit 474 partially differentiate the fourth order polynomial obtained by fitting, with respect to the directions of X and Y respectively. By this, a local gradient (Local Slope) of the substrate frontside with respect to directions of X and Y in a matrix coordinate can be obtained.

In S208, as a positional deviation amount calculation, in the case of writing a pattern on the substrate frontside, the positional deviation amount calculation unit 476 calculates a pattern positional deviation amount generated when correcting the height of the substrate frontside to be the same position as the surface of the pattern-less area 274 being a reference plane.

If the substrate is attached to the electrostatic chuck without any space and the substrate has no elasticity (the neutral plane becomes the substrate section central plane), the value obtained by multiplying a calculated local gradient amount by ½ (half) of the thickness of the substrate becomes a positional deviation amount of the pattern. That is, the positional deviation amount calculation unit 476 calculates a positional deviation amount of a pattern by multiplying a local gradient amount by ½ (half) of the thickness of the substrate.

In S210, as a coefficient calculation step, the coefficient calculation unit 478, based on the calculated positional deviation amount, calculates a coefficient of an approximate expression indicating a positional deviation correction amount for correcting the positional deviation amount, and approximates to be a third order polynomial, for example.

In S212, as an addition step, the addition unit 480 reads the default value 328 mentioned above from the HD apparatus 326 through the writing data processing circuit 322, and adds the coefficient obtained by the coefficient calculation unit 478. Thereby, the coordinate system of the pattern writing apparatus can be corrected by the positional deviation correction amount obtained by the approximate expression. By virtue of this correction, it becomes possible to write a pattern so that desired precision can be acquired when heights are 0 (zero) at all the measuring points by the sensor. That is, it can write as if being held by the electrostatic chuck, by adding correction data to the calculation circuit which corrects the coordinate system of the pattern writing apparatus, at each time of drawing. Thus, even if an electrostatic chuck is not employed in a pattern writing apparatus, it is possible to write as being held by the electrostatic chuck. Therefore, it becomes possible to obtain an EUV mask with a desired accuracy as if being held by the electrostatic chuck.

In S214, as a writing step, the writing optics unit 150 writes a pattern on the frontside of the substrate being the target workpiece 101, using the electron beam 200, based on a positional deviation correction amount obtained by the approximate expression indicating the positional deviation correction amount using an additional value acquired as a result of the addition. That is, in the writing data processing circuit 322, information on the positional deviation correction amount obtained by the approximate expression indicating the positional deviation correction amount using the coefficient obtained as a result of the addition is output to the deflection control circuit 320. Then, deflecting voltage controlled by the deflection control circuit 320 is applied to the deflector 208, and the electron beam 200 is deflected to be irradiated onto a predetermined position.

By virtue of structuring as mentioned above, even if the interferometer 510 does not perform backside measurement in advance, it is possible to obtain an EUV mask with which a desired accuracy can be acquired as being held by the electrostatic chuck.

It is also suitable for the variable-shaped EB pattern writing apparatus 100 to be a united structure of Embodiment 1 and Embodiment 5, or a united structure of Embodiment 4 and Embodiment 5. Then, when it is input as mask blank information that a substrate with extremely small thickness unevenness is used, the structure of Embodiment 5 may be selected to perform writing, and when the thickness unevenness is not small enough, the structure of Embodiment 1 or Embodiment 4 may be selected to perform writing.

Processing contents and operation contents of what is expressed by "circuit" or "process" in the above description can be configured by a computer-executable program. It may be executed by a software program, or alternatively by any combination of software, hardware and/or firmware. When configured by a program, the program is recordable or storable onto a recording medium, such as a magnetic disk drive, magnetic tape drive, ED or ROM (read-only memory).

Moreover, the calculator 450 serving as a computer in FIGS. 2, 18, and 24, or the calculator 660 serving as a computer in FIG. 13 may be connected, via a bus not illustrated, to a RAM (Random Access Memory), a ROM, and a magnetic disk (HD) drive serving as an example of a storage device, a keyboard (K/B) and a mouse serving as an example of an input means, a monitor and a printer serving as an example of an output means, an external interface (I/F), ED, DVD, CD serving as an example of an input/output means, etc.

Referring to concrete examples, Embodiments have been described in the above. However, the present invention is not limited to these examples.

Moreover, although description of apparatus components, control methods, etc. not directly required in explaining the present invention is omitted, it is possible to suitably select and use some or all of them when necessary. For example, while configuration of a control unit for controlling the variable-shaped EB writing apparatus 100 is not described in detail, it should be understood that needed control unit configuration can be suitably selected and used.

In addition, any other writing method of charged particle beams, writing apparatus of charged particle beams, measuring method of a positional deviation, and position measuring apparatus which include elements of the present invention and which are design-modifiable by those skilled in the art are incorporated within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing method comprising:
    measuring a topography of a backside of a substrate without an influence of a gravity sag;
    calculating a first positional deviation amount of a pattern written on a frontside of the substrate in a case of the backside of the substrate having been corrected to be flat, based on the the backside topography of the substrate;
    calculating a first coefficient of a first approximate expression indicating a positional deviation correction amount for correcting the first positional deviation amount, based on the first positional deviation amount;

adding the first coefficient to a second coefficient of a second approximate expression indicating a positional deviation correction amount for correcting a second positional deviation amount of the pattern written on the frontside of the substrate in a case of the backside of the substrate having not been corrected to be flat; and writing the pattern on the frontside of the substrate utilizing a charged particle beam, based on one of a positional deviation correction amount obtained by a third approximate expression indicating a positional deviation correction amount using a third coefficient obtained as a result of the adding, and the positional deviation correction obtained by the second approximate expression.

2. The charged particle beam writing method according to claim 1, wherein, when the substrate is for an EUV (Extreme Ultra Violet) mask, the writing is performed based on the positional deviation correction amount obtained by the third approximate expression, and when the substrate is not for the EUV mask, the writing is performed based on the positional deviation correction amount obtained by the second approximate expression.

3. The charged particle beam writing method according to claim 1 further comprising performing fitting of the backside topography of the substrate by using a polynomial expression.

4. The charged particle beam writing method according to claim 3 further comprising calculating a local gradient of the backside of the substrate by differentiating the polynomial expression.

5. The charged particle beam writing method according to claim 4, wherein the first positional deviation amount is calculated by multiplying the local gradient, a thickness of the substrate, and a predetermined coefficient.

6. The charged particle beam writing method according to claim 1 further comprising:
    inputting a value of height distribution of a chuck surface topography of an electrostatic chuck member to be used in either one of a position measuring apparatus and an exposure apparatus; and
    calculating a difference value between a value of height distribution of the backside topography of the substrate and the value of height-direction-axis of the chuck surface shape,
    wherein the first positional deviation amount is calculated by using the difference value as reference data of height distribution on the backside topography of the substrate.

7. The charged particle beam writing method according to claim 1, wherein, the measuring the backside topography of the substrate is performed, by using an interferometer, in a state of the substrate being arranged perpendicularly.

8. A charged particle beam writing apparatus which writes a pattern on a frontside of a substrate using a charged particle beam comprising:
    a positional deviation amount calculation unit for inputting information on a topography of a backside of the substrate, which is measured without an influence of a gravity sag of the substrate, and for calculating a first positional deviation amount of the pattern written on the frontside of the substrate in a case of the backside of the substrate having been corrected to be flat, based on inputted information on the backside topography of the substrate;
    a coefficient calculation unit for calculating a first coefficient of a first approximate expression indicating a positional deviation correction amount for correcting the first positional deviation amount, based on the first positional deviation amount;
    an addition unit for adding the first coefficient to a second coefficient of a second approximate expression indicating a positional deviation correction amount for correcting a second positional deviation amount of the pattern written on the frontside of the substrate in a case of the backside of the substrate having not been corrected to be flat; and
    a deflector for deflecting the charged particle beam, based on one of a positional deviation correction amount obtained by a third approximate expression indicating a positional deviation correction amount using a third coefficient obtained as a result of the adding, and the positional deviation correction amount obtained by the second approximate expression.

9. The charged particle beam writing apparatus according to claim 8 wherein, when the substrate is for an EUV (Extreme Ultra Violet) mask, the deflector deflects the charged particle beam, based on the positional deviation correction amount obtained by the third approximate expression, and when the substrate is not for the EUV mask, deflects the charged particle beam, based on the positional deviation correction amount obtained by the second approximate expression.

10. The charged particle beam writing apparatus according to claim 9 further comprising a storage device for storing the second coefficient, and wherein the addition unit reads the second coefficient from the storage device and adds it to the first coefficient.

11. A charged particle beam writing apparatus which writes a pattern on a frontside of a substrate using a charged particle beam comprising:
    a stage on which the substrate is mounted;
    a reference member, to be mounted on the stage, having a reference plane that is regarded as a height reference of the frontside of the substrate;
    a sensor for measuring height of the reference plane and height of the frontside of the substrate;
    a positional deviation amount calculation unit for calculating a positional deviation amount of the pattern which is generated in a case of correcting the height of the frontside of the substrate to be equivalent to the height of the reference plane when writing the pattern on the frontside of the substrate, based on a difference value between the height of the frontside of the substrate and the height of the reference plane;
    a coefficient calculation unit for calculating a coefficient of an approximate expression indicating a positional deviation correction amount for correcting the positional deviation amount, based on the positional deviation amount; and
    a deflector for deflecting the charged particle beam onto a corrected position obtained by correcting the positional deviation correction amount acquired by the approximate expression.

12. The charged particle beam writing apparatus according to claim 11, wherein the reference member is composed of a silicon chip.

13. The charged particle beam writing apparatus according to claim 12, wherein the silicon chip has a predetermined mark formed thereon.

14. The charged particle beam writing apparatus according to claim 13, wherein an area on the silicon chip, where no predetermined mark is formed, is used as the reference plane.

15. The charged particle beam writing apparatus according to claim 14, further comprising a step member, arranged near the reference member, including a plurality of planes each of which is different in height, wherein a gain of the sensor is adjusted using the plurality of planes.

16. The charged particle beam writing apparatus according to claim 15, wherein the plurality of planes is applied coating of a film having antireflection effect of 50% and more against an incident light used for the sensor for measuring height.

17. The charged particle beam writing apparatus according to claim 16, wherein the sensor is an optical lever sensor.

* * * * *